(12) United States Patent
Sagawa et al.

(10) Patent No.: US 10,529,813 B2
(45) Date of Patent: Jan. 7, 2020

(54) SEMICONDUCTOR DEVICE, POWER MODULE, AND POWER CONVERSION DEVICE

(71) Applicant: HITACHI POWER SEMICONDUCTOR DEVICE, LTD., Hitachi-shi, Ibaraki (JP)

(72) Inventors: Masakazu Sagawa, Tokyo (JP); Takashi Ishigaki, Ibaraki (JP)

(73) Assignee: HITACHI POWER SEMICONDUCTOR DEVICE, LTD., Ibaraki (JP)

( * ) Notice: Subject to any disclaimer, the term of this patent is extended or adjusted under 35 U.S.C. 154(b) by 0 days.

(21) Appl. No.: 16/189,608

(22) Filed: Nov. 13, 2018

(65) Prior Publication Data
US 2019/0288082 A1 Sep. 19, 2019

(30) Foreign Application Priority Data
Mar. 16, 2018 (JP) .................... 2018-049883

(51) Int. Cl.
*H01L 29/778* (2006.01)
*H01L 29/40* (2006.01)
(Continued)

(52) U.S. Cl.
CPC ........ *H01L 29/408* (2013.01); *H01L 23/5226* (2013.01); *H01L 29/0619* (2013.01);
(Continued)

(58) Field of Classification Search
CPC .................. H01L 29/1095; H01L 29/7787
See application file for complete search history.

(56) References Cited

U.S. PATENT DOCUMENTS 9,006,819 B2 4/2015 Hino et al.
2005/0029584 A1* 2/2005 Shiraishi ............. H01L 29/1095
257/329
(Continued)

FOREIGN PATENT DOCUMENTS

JP 2005-032736 A 2/2005
JP 5692227 B2 4/2015
(Continued)

OTHER PUBLICATIONS

Extended European Search Report dated May 27, 2019 for EP Application No. 18202936.3.

*Primary Examiner* — Thomas L Dickey
(74) *Attorney, Agent, or Firm* — Miles & Stockbridge, P.C.

(57) ABSTRACT

A semiconductor device including an n-type semiconductor layer formed on a substrate, having a cell region and a gate pad region, and including silicon carbide, and a unit cell formed in the cell region is configured as follows. A p-type body region formed in the semiconductor layer of the gate pad region, a first insulating film formed on the p-type body region, a conductive film formed on the first insulating film, and a second insulating film formed on the conductive film, and a gate pad formed on the second insulating film. Then, the film thickness of the first insulating film is 0.7 μm or more, and more favorably 1.5 μm or more. In addition, the electric field strength of the first insulating film is 3 MV/cm or less. Then, an opening portion is formed on the first insulating film in the gate pad region, and a resistance portion and a connection portion corresponding to the conductive film are formed in the opening portion.

15 Claims, 33 Drawing Sheets

(51) Int. Cl.
    *H01L 23/522*     (2006.01)
    *H01L 29/06*     (2006.01)
    *H01L 29/16*     (2006.01)
    *H01L 29/423*     (2006.01)
    *H01L 29/66*     (2006.01)
    *H01L 29/78*     (2006.01)

(52) U.S. Cl.
    CPC ...... *H01L 29/0696* (2013.01); *H01L 29/1608* (2013.01); *H01L 29/4238* (2013.01); *H01L 29/42372* (2013.01); *H01L 29/66068* (2013.01); *H01L 29/7803* (2013.01); *H01L 29/7804* (2013.01)

(56) References Cited

U.S. PATENT DOCUMENTS

| | | |
|---|---|---|
| 2012/0217555 A1 | 8/2012 | Saito et al. |
| 2013/0020587 A1* | 1/2013 | Hino .................. H01L 29/1095 257/77 |

FOREIGN PATENT DOCUMENTS

| | | |
|---|---|---|
| JP | 2017005278 A | 1/2017 |
| WO | 2017029748 A1 | 2/2017 |

\* cited by examiner

[Device parameter]
$R = R_s/2$ [W]
$C_{ox} = A\varepsilon_0\varepsilon_{ox}/t_{ox}$ [F]
$C_j = AC_0[1+V_r/V_j]^{-m}$ [F]

FIG. 26

| Oxide thickness | Field | 300nm |
|---|---|---|
| | Inter layer insulator | 350nm |
| Sheet resistance | PB | PB186kΩ/□ |
| | P+ | P+78kΩ/□ |
| Capacitance | PB/n-epi | Cj0=19.8nF/cm², m=0.53, vj=1.7V |
| | FG/PB | Cox=11.6nF/cm² |
| | M1/PB | Cox2=5.3nF/cm² |
| Drive | Vcc | 1.8kV |
| | dV/dt(off) | 2.8kV/μs |
| | dV/dt(on) | 1.8kV/μs |

SEMICONDUCTOR DEVICE, POWER MODULE, AND POWER CONVERSION DEVICE

BACKGROUND OF THE INVENTION

1. Field of the Invention

The present invention relates to a semiconductor device, a power module, and a power conversion device, and in particular to a structure of a power device using silicon carbide.

2. Description of the Related Art

While semiconductor power devices require high breakdown voltage, low ON resistance, and low switching loss, silicon (Si) power devices, which are mainstream at present, are approaching theoretical performance limits. Since silicon carbide (SiC) is about an order of magnitude greater than Si in dielectric breakdown electric field strength, device resistance of SiC power devices can be theoretically decreased by three orders of magnitude less than that of Si power devices by thinning a drift layer having a breakdown voltage by about 1/10 and increasing the impurity concentration by about 100 times. In addition, the SiC power devices can perform a high-temperature operation because the band gap of SiC is about 3 times larger than that of Si, and the SiC power devices are expected to have performance exceeding the Si power devices.

As described above, SiC has the characteristics of the larger band gap and higher breakdown electric field strength than Si. However, in the case of applying SiC to a device such as a metal-oxide-semiconductor field effect transistor (MOSFET), an electric field applied to an insulating film constituting the device becomes a problem.

For example, JP 2017-5278 A discloses a power semiconductor device using a semiconductor substrate composed of a wideband gap material, the power semiconductor device including a gate insulating film formed on a second well region on a cell region side, a field insulating film formed on the second well region on an opposite side of the cell region side, and having a larger film thickness than a gate insulating film, and a gate electrode formed on the gate insulating film and on the field insulating film. The power semiconductor device further includes a second well contact hole formed on a second well region on an opposite side of the cell region side with respect to a boundary between the gate insulating film and the field insulating film, and a source pad electrically connecting the cell region and the second well region through the second well contact hole.

Further, JP 5692227 B2 discloses a power semiconductor device including a first conductivity-type drift layer, a second conductivity-type second well region formed to surround a first well region of the drift layer, and a field insulating film formed on the second well region on an opposite side of the first well region side. Then, a source pad electrically connecting the second well region and the source region via a well contact hole provided to penetrate a gate insulating film formed on the second well region on the first well region side is disclosed. Then, JP 5692227 B2 prevents insulating breakdown of the insulating film such as the gate insulating film by setting a distance from the well contact hole to the boundary between the gate insulating film and the field insulating film to a predetermined value or less.

SUMMARY OF THE INVENTION

The present inventors are engaged in research and development on MOSFETs using SiC. In the research and development, the inventors have confronted a phenomenon in which deterioration of an insulating film (field oxide film) having a relatively large film thickness among insulating films constituting the MOSFET becomes a problem.

Therefore, the inventors have investigated the cause of the above problem and have found a configuration of a semiconductor device with favorable characteristics.

The above and other objects and novel features of the present invention will become clear from the description of the present specification and the accompanying drawings.

Among the embodiments disclosed in the present application, an outline of representative examples is briefly described as follows.

A semiconductor device described in an embodiment disclosed in the present application includes a first conductivity-type drift layer formed on a substrate, having a cell region and a gate pad region, and including silicon carbide, and a unit cell formed in the cell region. Then, the semiconductor device includes (a1) a second conductivity-type first body region having a reverse conductivity-type to the first conductivity-type, and formed in the drift layer in the gate pad region, and (a2) a first insulating film formed on the first body region. Then, the semiconductor device further includes (a3) a first conductive film formed on the first insulating film, (a4) a second insulating film formed on the first conductive film, and (a5) a gate pad formed on the second insulating film. Then, the film thickness of the first insulating film is 0.7 μm or more.

A semiconductor device described in an embodiment disclosed in the present application includes a first conductivity-type drift layer formed on a substrate, having a cell region and a gate pad region, and including silicon carbide, and a unit cell formed in the cell region. Then, the semiconductor device includes (a1) a second conductivity-type first body region having a reverse conductivity-type to the first conductivity-type, and formed in the drift layer in the gate pad region, and (a2) a first insulating film formed on the first body region. Then, the semiconductor device further includes (a3) a first conductive film formed on the first insulating film, (a4) a second insulating film formed on the first conductive film, and (a5) a gate pad formed on the second insulating film. Then, the film thickness of the first insulating film is 1.5 μm or more, and a region in which the first conductive film is not formed is included on the first insulating film in the gate pad region.

According to the semiconductor device described in the representative embodiments disclosed in the present application, characteristics of the semiconductor device can be improved. In addition, performance of a power module and a power conversion device using this semiconductor device can be improved.

BRIEF DESCRIPTION OF THE DRAWINGS

FIG. 26 is a diagram illustrating simulation conditions;

DESCRIPTION OF THE PREFERRED EMBODIMENTS

Figure 1:
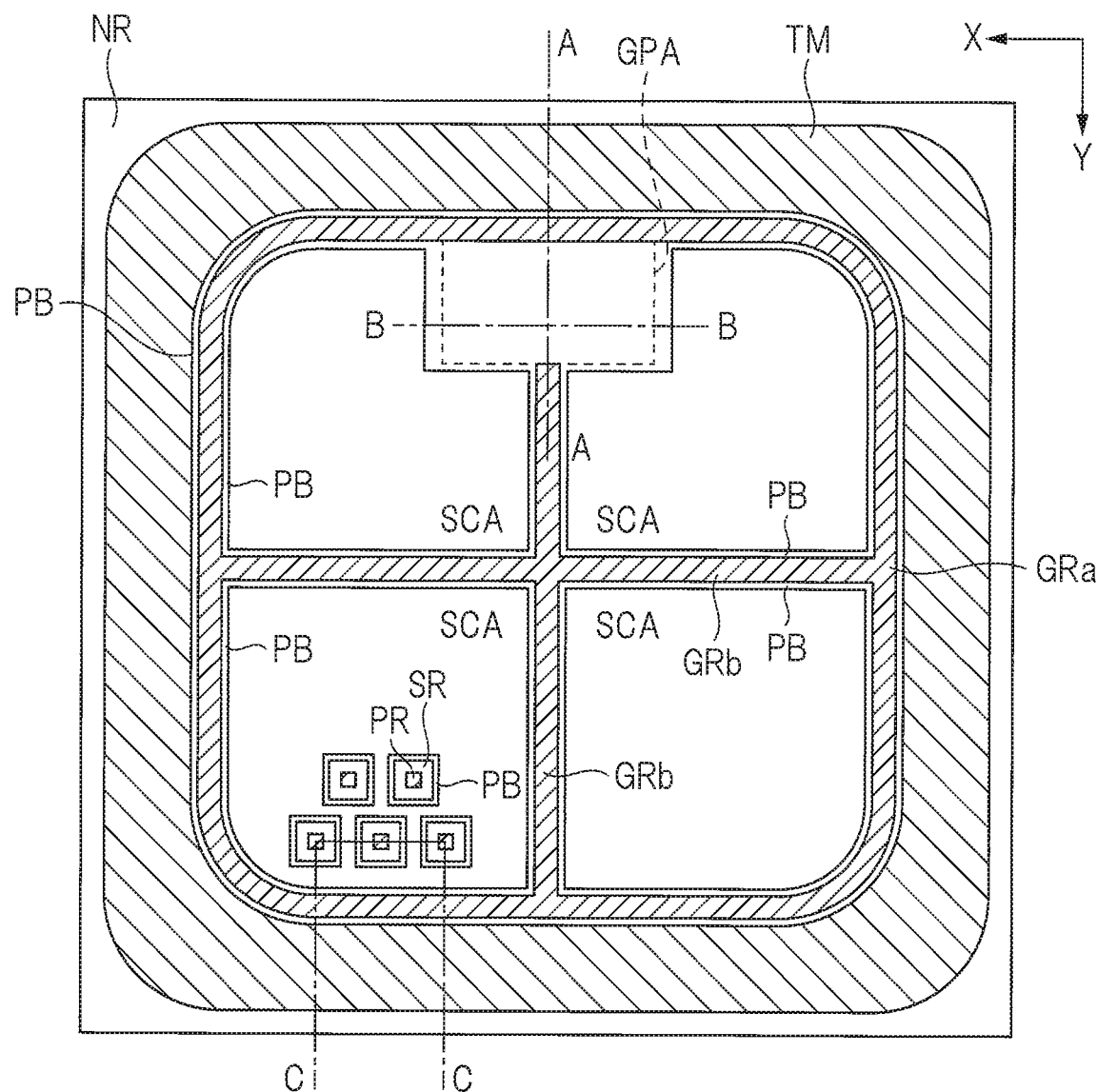
FIG. 1 is a plan view illustrating a configuration of a semiconductor device according to a first embodiment.

Hereinafter, embodiments of the present invention will be described in detail with reference to the drawings. In all the drawings for describing the embodiments, the same reference numeral is given to members having the same function, and repetitive description thereof is omitted. In addition, in the embodiments, description of the same or similar parts are not repeated as a general rule unless particularly necessary. In addition, in the drawings for describing the embodiments, hatching may be given even to a plan view, a perspective view, or the like to make the configuration easy to understand. Further, in the drawings for describing the embodiments, hatching may be omitted in a cross-sectional view to make the configuration easy to understand. In addition, in a cross-sectional view and a plan view, the size of each portion does not correspond to an actual device, and a specific portion may be displayed relatively large to make the drawings easy to understand. In addition, even in the case where a cross-sectional view and a plan view correspond to each other, a specific portion may be displayed relatively large to make the drawings easy to understand.

In addition, symbols "−" and "+" represent relative concentrations of n-type or p-type impurities of conductivity type. For example, in the case of the n-type impurities, the impurity concentration becomes higher in order of "n$^-$", "n", "n$^+$".

First Embodiment

Hereinafter, a semiconductor device of the present embodiment will be described in detail with reference to the drawings.

[Structure Description]

Figure 2:
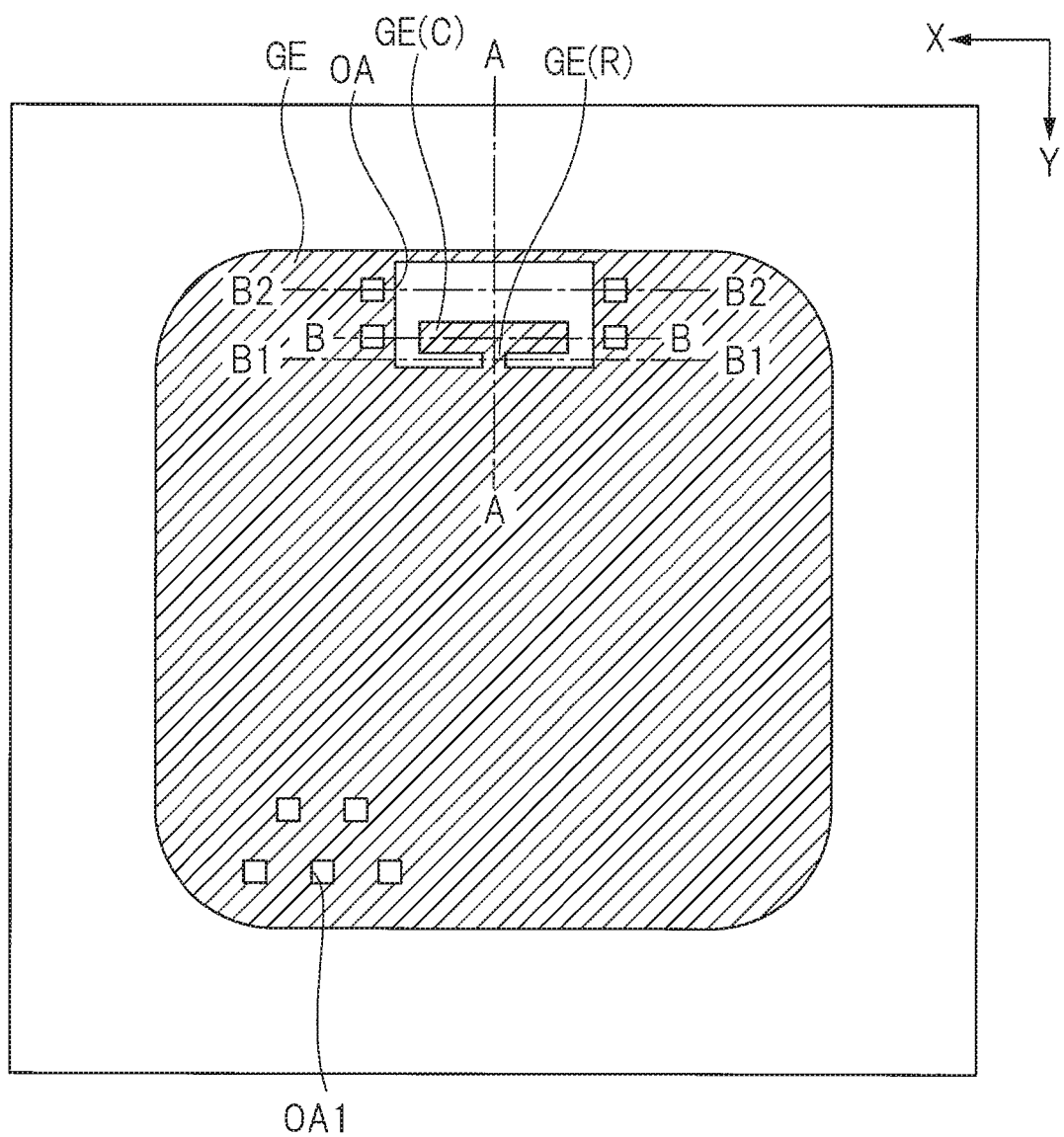
FIG. 2 is a plan view illustrating the configuration of the semiconductor device according to the first embodiment.
Figure 3:
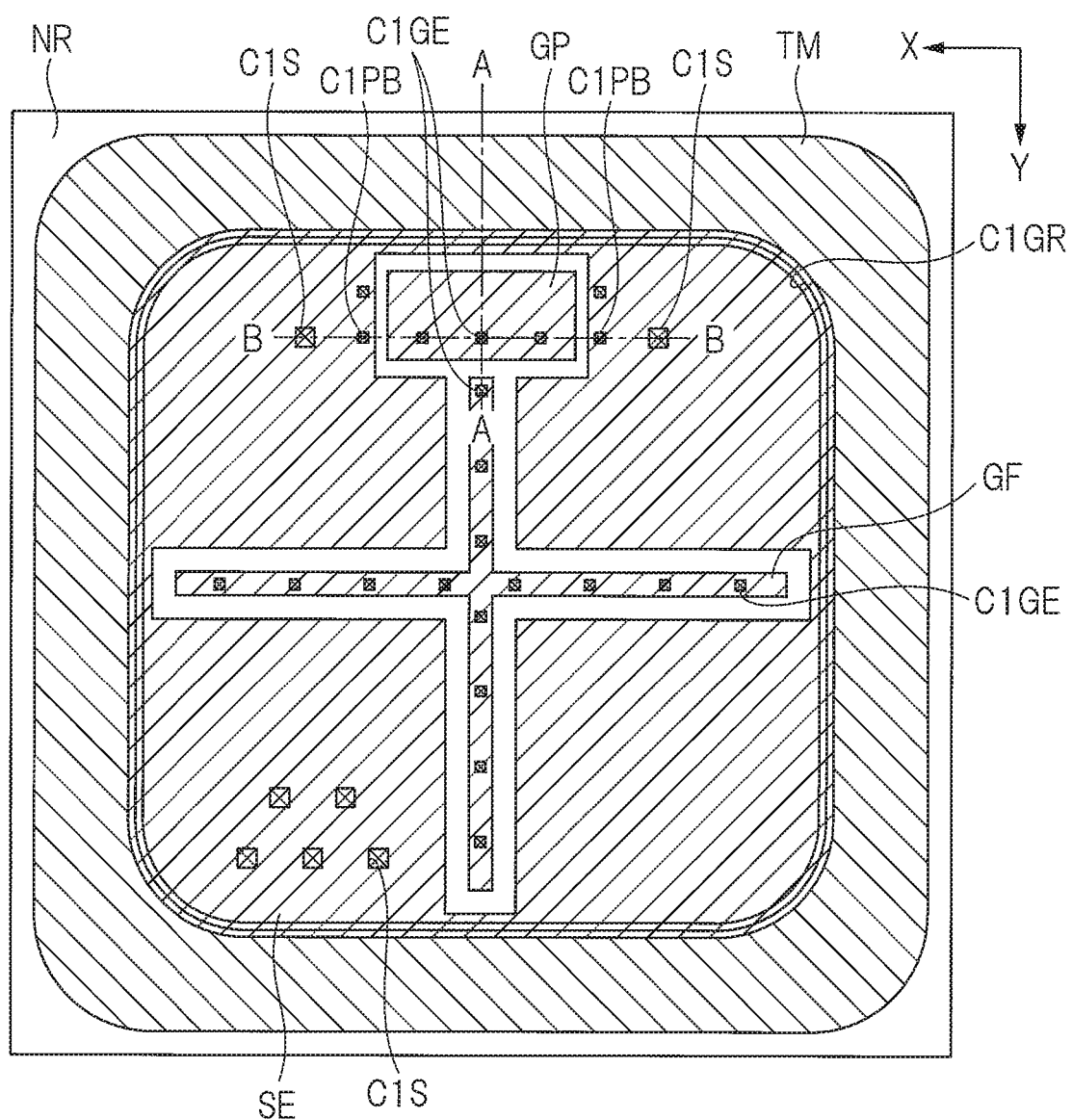
FIG. 3 is a plan view illustrating the configuration of the semiconductor device according to the first embodiment.

FIG. 1 to FIGS. 5A and 5B are plan views and cross-sectional views illustrating a configuration of a semiconductor device of the present embodiment. FIGS. 1 to 3 are plan views and FIGS. 4A to 4C and FIGS. 5A and 5B are cross-sectional views. In the cross-sectional views of FIGS. 4A to 4C, FIGS. 4A, 4B, and 4C respectively correspond to an A-A cross-sectional portion, a B-B cross-sectional portion, and a C-C cross-sectional portion of the plan view. In addition, in the cross-sectional views of FIGS. 5A and 5B, FIGS. 5A and 5B respectively correspond to a B1-B1 cross-sectional portion and a B2-B2 cross-sectional portion of FIG. 2 (plan view).

The semiconductor device of the present embodiment has a cell region, a gate pad forming region GPA, and a peripheral region. Here, the cell region includes a plurality of subcell regions SCA.

Figure 4A:
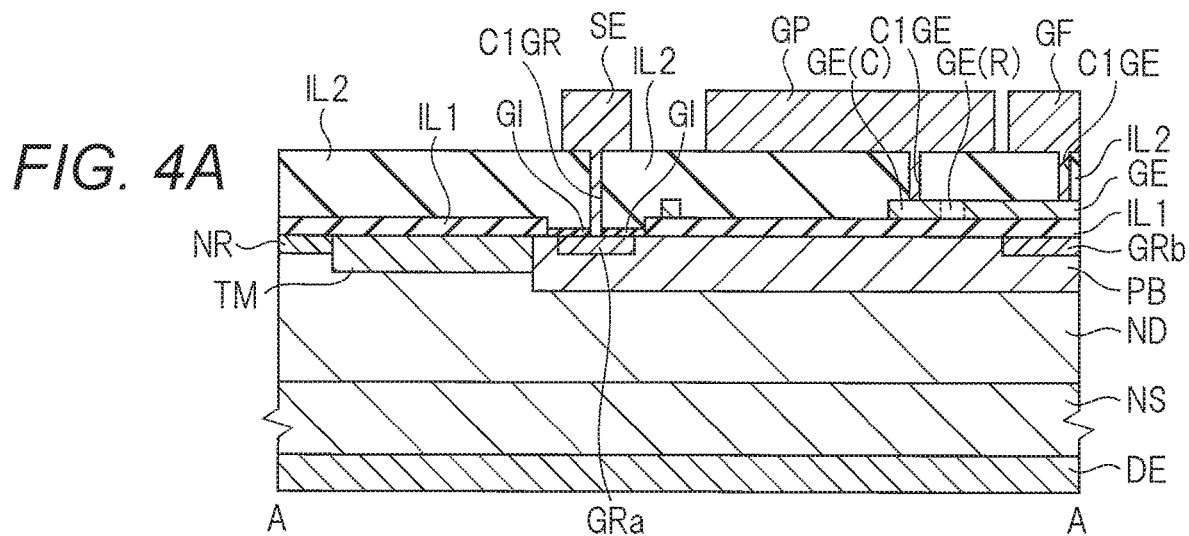
FIGS. 4A to 4C are cross-sectional views illustrating the configuration of the semiconductor device according to the first embodiment.
Figure 4B:
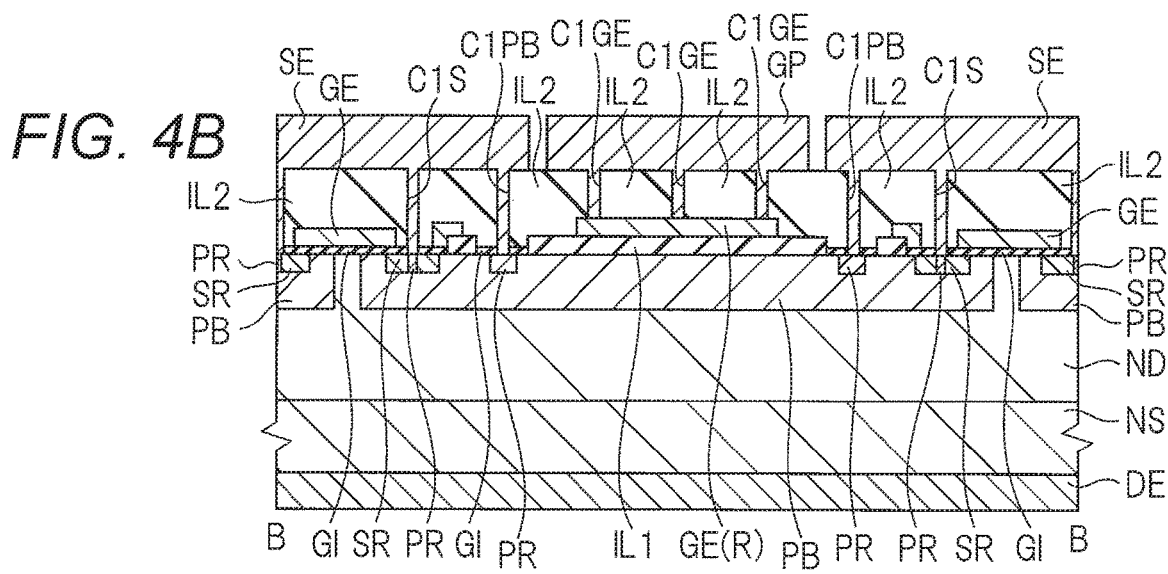
Figure 4C:
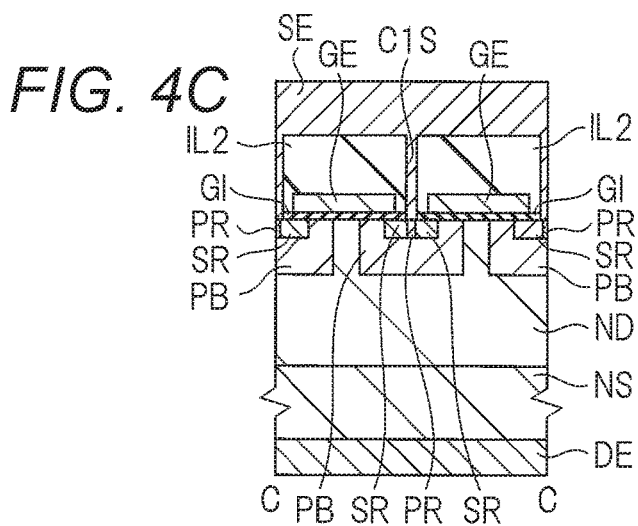

In the cell region (subcell region SCA), a MOSFET, a source electrode SE, and the like illustrated in FIG. 4C are formed. Further, a gate pad GP is formed in the gate pad forming region GPA (FIG. 4B). Further, a p-type semiconductor region (termination region) TM, an $n^+$-type semiconductor region NR around the p-type semiconductor region TM, and the like are formed in the peripheral region (FIG. 4A).

FIG. 1 illustrates various semiconductor regions provided on a main surface of an $n^-$-type semiconductor layer (epitaxial layer) ND composed of Si on an $n^+$-type SiC substrate NS. The $n^-$-type semiconductor layer ND mainly serves as a drift layer. That is, FIG. 1 illustrates an upper surface of the $n^-$-type semiconductor layer ND, and illustration of a gate insulating film, a gate electrode, an insulating film, a gate pad, a source electrode, and the like on the $n^-$-type semiconductor layer ND is omitted.

Specifically, FIG. 1 illustrates the peripheral region surrounding the cell region (subcell regions SCA). In the peripheral region, the p-type semiconductor region (termination region) TM and the $n^+$-type semiconductor region NR are illustrated. Further, FIG. 1 illustrates a $p^+$-type semiconductor region GRa surrounding the four subcell regions SCA and a semiconductor region GRb between the subcell regions SCA. The semiconductor region GRb has a cross shape. Further, FIG. 1 illustrates a p-type body region PB including the $p^+$-type semiconductor regions GRa and GRb therein and a p-type body region PB provided in the gate pad forming region GPA. Further, FIG. 1 illustrates a source region SR constituting the MOSFET, a $p^+$-type semiconductor region PR adjacent to the source region, and a p-type body region PB including the source region SR and the $p^+$-type semiconductor region PR therein.

Although not illustrated in FIG. 1, a p-type semiconductor region PR for supplying a source potential is provided in the p-type body region PB of the region GPA. In this way, the source potential is supplied to the p-type body region PB of the region GPA via a plug (well contact) and the $p^+$-type semiconductor region PR in a contact hole (C1PB) (see FIG. 4B).

FIG. 2 illustrates a gate electrode GE of the cell region (subcell regions SCA), and a resistance portion GE(R) and a connection portion GE(C) of the gate pad forming region GPA. The resistance portion GE(R) and the connection portion GE(C) are made of the same conductive film as the gate electrode GE. In other words, the resistance portion GE(R) and the connection portion GE(C) are in the same layer as the gate electrode GE.

FIG. 3 illustrates the source electrode (source pad) SE of the cell region (subcell regions SCA), and the gate pad GP of the gate pad forming region GPA. In addition, FIG. 3 illustrates a gate finger GF between the subcell regions (SCA). The gate finger GF has a cross shape.

Here, in the present embodiment, an insulating film (field oxide film) IL1 is formed in the gate pad forming region GPA illustrated in FIG. 1 (FIGS. 4A to 4C and FIGS. 5A and 5B). The film thickness of the insulating film (field oxide film) IL1 is 0.7 μm or more, and more favorably 1.5 μm or more. In addition, at the time of operation of the MOSFET, electric field strength applied to the insulating film (field oxide film) IL1 is 3 MV/cm or less.

By increasing the film thickness of the insulating film (field oxide film) IL1 below the gate pad GP in this way, breakdown of the insulating film (field oxide film) IL1 due to a surge voltage occurring at the time of switching can be suppressed.

In particular, as will be described below, in the case where an opening portion OA is provided in the gate electrode GE arranged below the gate pad GP, a residual (defect) of the gate electrode sometimes occurs in the opening portion OA. In such a case, the insulating film (field oxide film) IL1 is easily broken down due to influence of the residual and an overvoltage of the gate electrode GE. However, by increasing the film thickness of the insulating film (field oxide film) IL1, the breakdown can be suppressed.

Next, a configuration of the semiconductor device of the present embodiment will be described in detail with reference to FIG. 1 to FIGS. 5A and 5B.

A plurality of unit cells (MOSFETs) is formed in the cell region (subcell regions SCA). This MOSFET is a MOSFET having a planar double diffused metal oxide semiconductor (DMOS) structure. As illustrated in FIG. 4C, the MOSFET includes the $n^+$-type source region SR, the p-type body region PB serving as a channel region, and the gate electrode GE arranged on the channel region via a gate insulating film GI. Note that the $n^+$-type SiC substrate NS functions as a drain region.

In other words, the unit cell includes the body region PB formed in the $n^-$-type semiconductor layer (epitaxial layer) ND of the subcell region, the source region SR formed in the body region PB, the gate insulating film GI formed on the body region PB between the source region SR and an exposed portion of the semiconductor layer ND, and the gate electrode GE formed on the gate insulating film GI.

In plan view, as illustrated in FIG. 1, the $n^+$-type source region SR is arranged to be surrounded by the p-type body region PB, and the $p^+$-type semiconductor region PR is arranged inside the $n^+$-type source region SR. The $p^+$-type semiconductor region PR serves as a contact region for drawing out the source region SR. Further, the p-type body region PB and the $n^-$-type semiconductor layer (drift layer) ND that is a lower layer of the p-type body region PB constitute a diode (that is, a body diode).

In this way, by incorporating the body diode in the semiconductor device, it is not necessary to separately prepare a chip on which a diode is mounted. Therefore, reduction in size and weight of the device becomes possible.

In FIG. 1, the source region SR having a square planar shape is arranged inside the p-type body region PB having a square planar shape, and the $p^+$-type semiconductor region PR having a square planar shape is further arranged inside the source region SR having a square planar shape. Unit regions each having such a configuration are arranged in an array manner, and for example, the gate electrode GE is arranged between the unit regions (between adjacent $p^+$-type semiconductor regions PR) via the gate insulating film GI (see FIG. 4C). The gate electrode GE is covered with an insulating film (interlayer insulating film) IL2, and the $p^+$-type semiconductor region PR is connected to the source electrode SE via a plug in a contact hole C1S. Further, the gate electrode GE is connected to the gate finger GF via a plug in a contact hole C1GE (see FIG. 3).

Further, as illustrated in FIG. 2, the gate electrode GE is connected to the gate pad GP via the resistance portion GE(R) provided in the gate pad forming region GPA. In other words, the conductive film constituting the gate electrode GE has the opening portion OA in the gate pad forming region GPA, and the resistance portion GE(R) and the connection portion GE(C) in the same layer as the gate electrode GE are provided in the opening portion OA. The length of the resistance portion GE(R) in an X direction is smaller than the length of the opening portion in the X direction. Further, the length of the resistance portion GE(R)

in the X direction is smaller than the length of the connection portion GE(C) in the X direction. The connection portion GE(C) is provided with a plug connected to the gate pad GP. This plug is provided in the contact hole C1GE (see FIG. 3).

Figure 5A:
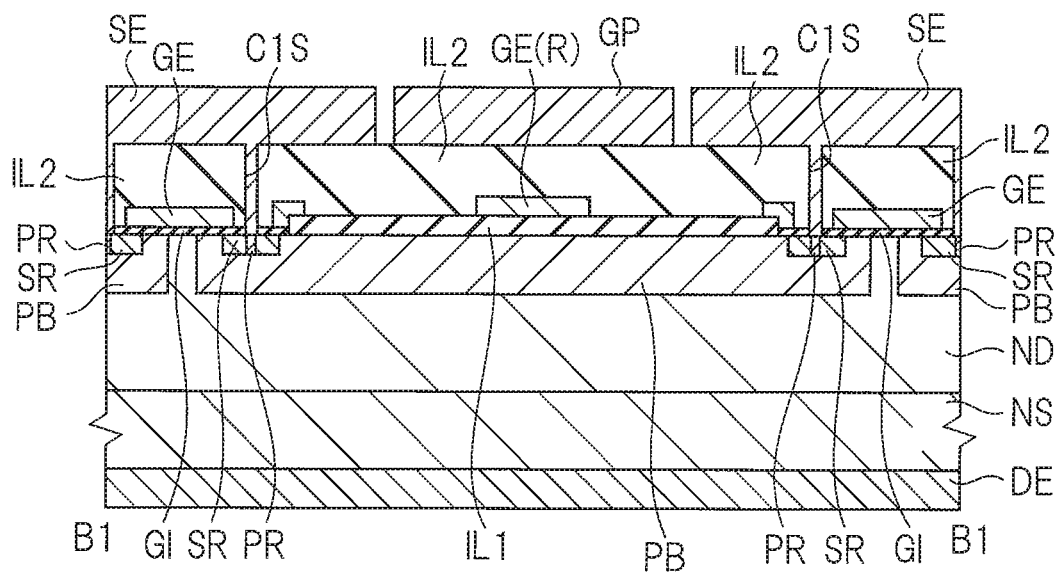
FIGS. 5A and 5B are cross-sectional views illustrating the configuration of the semiconductor device according to the first embodiment.
Figure 5B:
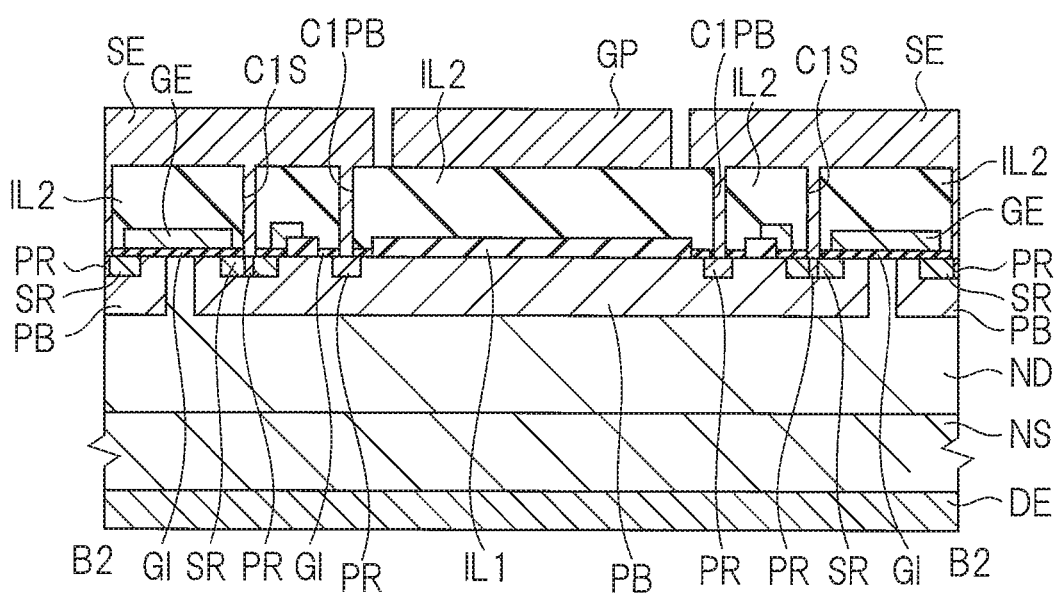

Here, in the gate pad forming region GPA, the resistance portion GE(R) and the connection portion GE(C) in the same layer as the gate electrode GE are formed on the insulating film (field oxide film) IL1 (FIG. 5A). Further, as described above, there is the region (opening portion OA) where the conductive film (the resistance portion GE(R) and the connection portion GE(C)) in the same layer as the gate electrode GE is not formed, in the insulating film (field oxide film) IL1 (FIG. 5B).

More specifically, the gate pad forming region GPA is provided with the body region PB formed in the semiconductor layer (epitaxial layer) ND, the insulating film (field oxide film) IL1 formed on the body region PB, the conductive film (the resistance portion GE(R) and the connection portion GE(C)) formed on the insulating film (field oxide film) IL1, the insulating film IL2 formed on the conductive film, and the gate pad GP formed on the insulating film IL2 (see FIG. 4B).

Figure 12:
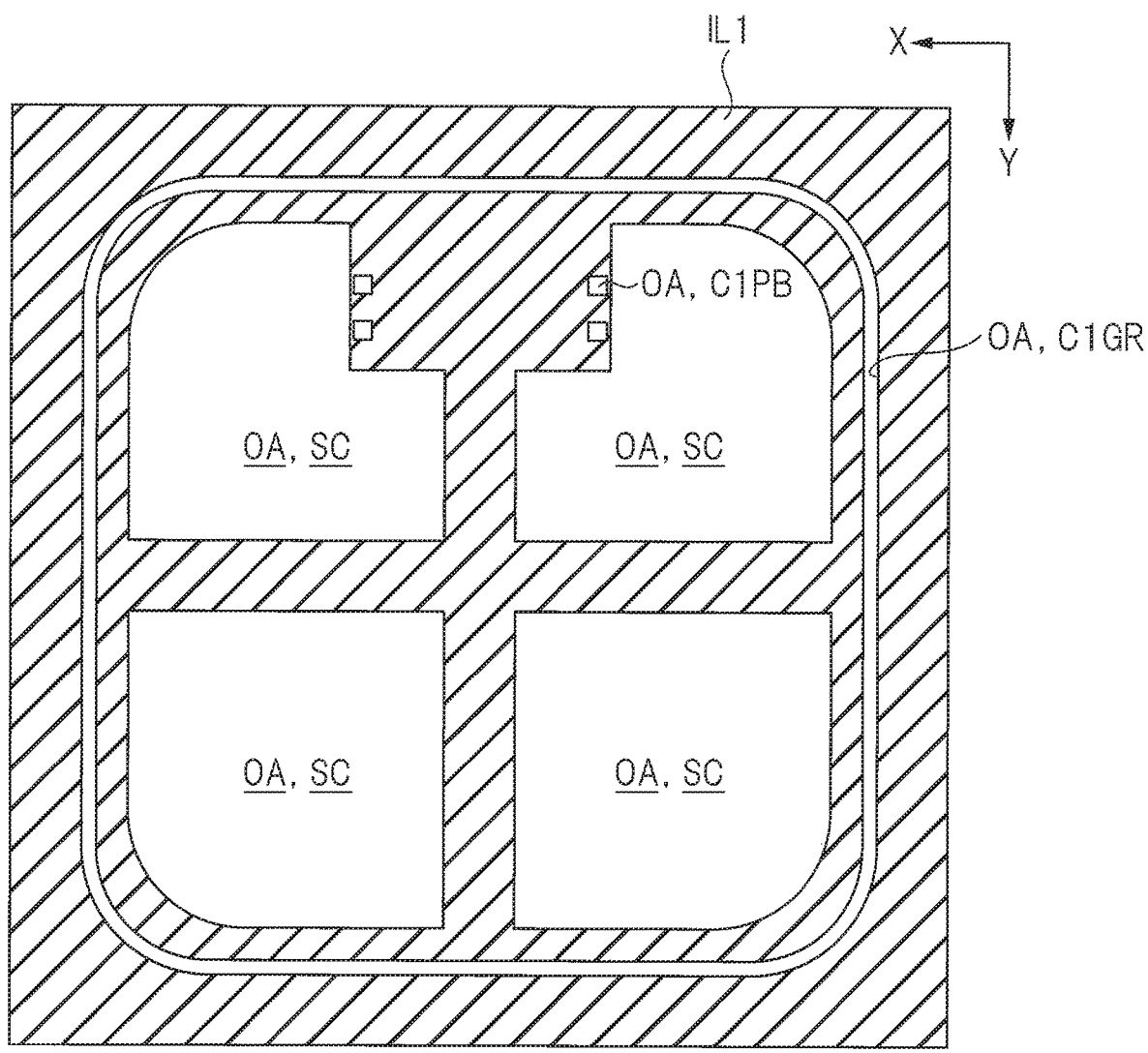
FIG. 12 is a plan view illustrating the process of manufacturing the semiconductor device according to the first embodiment.

As described above, the insulating film (field oxide film) IL1 is arranged above the semiconductor layer (epitaxial layer) ND below the gate pad GP and in the peripheral region (see FIG. 12). There has been a risk that this insulating film (field oxide film) IL1 is broken down due to the influence of the surge voltage. However, in the present embodiment, the film thickness of the insulating film (field oxide film) IL1 is set to 0.7 μm or more, whereby the breakdown of the insulating film (field oxide film) IL1 can be suppressed even if the surge voltage occurs, as described below. Further, even in the case of the configuration in which the opening portion OA is provided in the gate electrode GE below the gate pad GP by setting the film thickness of the insulating film (field oxide film) IL1 to 1.5 μm or more, the breakdown of the insulating film (field oxide film) IL1 can be suppressed. In addition, the electric field strength applied to the insulating film (field oxide film) IL1 can be suppressed to 3 MV/cm or less.

[Manufacturing Method Description]

Next, a process of manufacturing the semiconductor device of the present embodiment will be described, and the structure of the semiconductor device of the present embodiment will be further clarified. FIGS. 6A to 6C to FIGS. 18A to 18C are cross-sectional views and plan views illustrating a process of manufacturing the semiconductor device of the present embodiment.

Figure 6A:
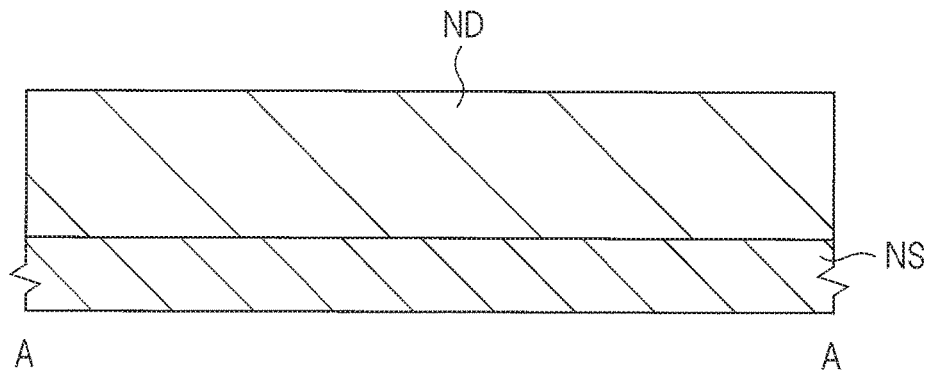
FIGS. 6A to 6C are cross-sectional views illustrating a process of manufacturing the semiconductor device according to the first embodiment.
Figure 6B:
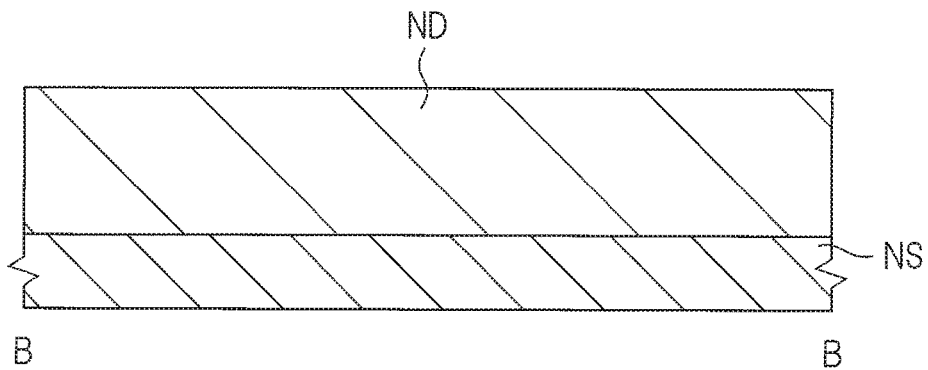
Figure 6C:
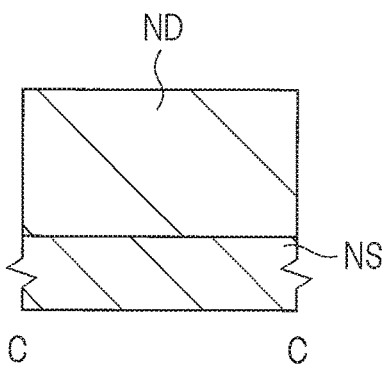

First, as illustrated in FIGS. 6A to 6C, the n$^+$-type SiC substrate NS is prepared. An n-type impurity is introduced at relatively high concentration into the SiC substrate NS. This n-type impurity is, for example, nitrogen (N), and the impurity concentration of the n-type impurity is, for example, $1 \times 10^{17}$ to $1 \times 10^{19}$ cm$^{-3}$. A principal plane of the SiC substrate NS is, for example, a {0001} plane.

Next, the n$^-$-type semiconductor layer ND is formed on the principal plane of the SiC substrate NS. For example, the n$^-$-type semiconductor layer (epitaxial layer) of SiC is formed on the principal plane of the SiC substrate NS by epitaxial growth. The n-type impurity having lower impurity concentration than the SiC substrate NS is introduced into the n$^-$-type SiC substrate ND. The impurity concentration of the n$^-$-type semiconductor layer ND depends on a rated breakdown voltage of the device, and is, for example, $1 \times 10^{14}$ to $1 \times 10^{17}$ cm$^{-3}$. Further, the thickness of the n$^-$-type semiconductor layer ND is, for example, 30 μm. The thickness of the n$^-$-type semiconductor layer ND can be adjusted within a range of, for example, 3 to 80 μm, depending on the breakdown voltage of the device.

Figure 7A:
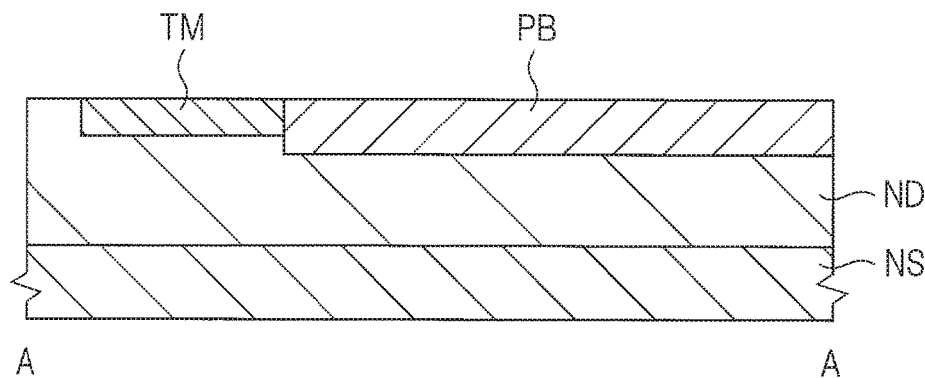
FIGS. 7A to 7C are cross-sectional views illustrating the process of manufacturing the semiconductor device according to the first embodiment.
Figure 7B:
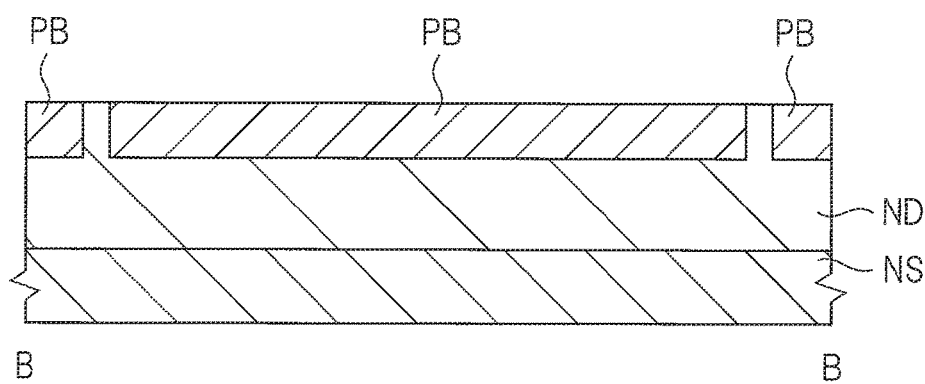
Figure 7C:
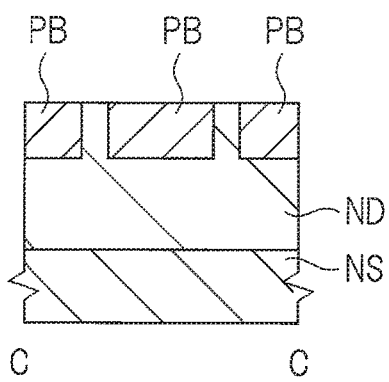

Next, as illustrated in FIGS. 7A to 7C, the p-type semiconductor region TM is formed in the peripheral region surrounding the device region (the cell region, the subcell regions, a device forming region, and an active region). For example, a mask film (not illustrated, for example, a silicon oxide film) having an opening portion in the forming region of the p-type semiconductor region TM is formed and a p-type impurity (for example, aluminum (Al)) is ion-implanted. As a result, the rectangular annular p-type semiconductor region TM can be formed in the n$^-$-type semiconductor layer ND in the peripheral region surrounding the device region (see FIG. 1). The depth of the p-type semiconductor region TM is, for example, about 0.5 to 2.0 μm from a surface of the n$^-$-type semiconductor layer ND. Further, the impurity concentration of the p-type semiconductor region TM is, for example, $1 \times 10^{16}$ to $5 \times 10^{19}$ cm$^{-3}$.

Next, after the mask is removed, the p-type body regions (also called p-type well regions) PB that are the p-type semiconductor regions are formed in the device region in an array manner (see FIG. 1. Note that FIG. 1 illustrates a part of the p-type body regions PB in the array manner). Further, at this time, the p-type body region PB is also formed in regions including the forming region of the p$^+$-type semiconductor regions GRa and GRb illustrated in FIG. 1.

Figure 10:
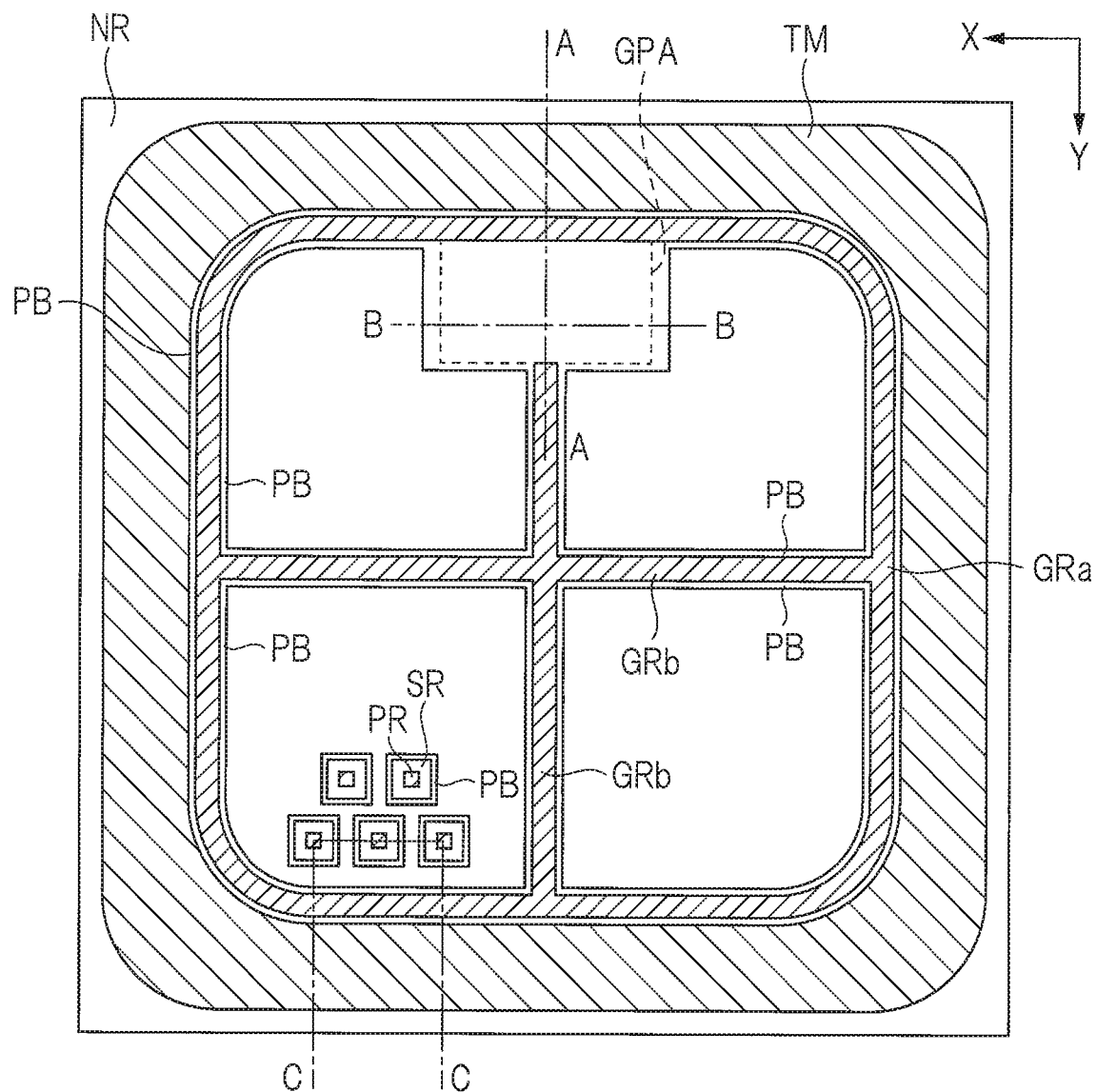
FIG. 10 is a plan view illustrating the process of manufacturing the semiconductor device according to the first embodiment.
Figure 11A:
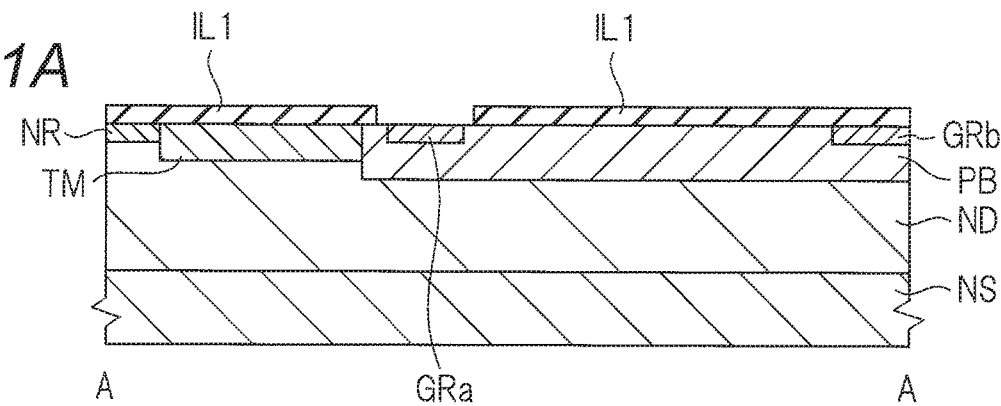
FIGS. 11A to 11C are cross-sectional views illustrating the process of manufacturing the semiconductor device according to the first embodiment.
Figure 11B:
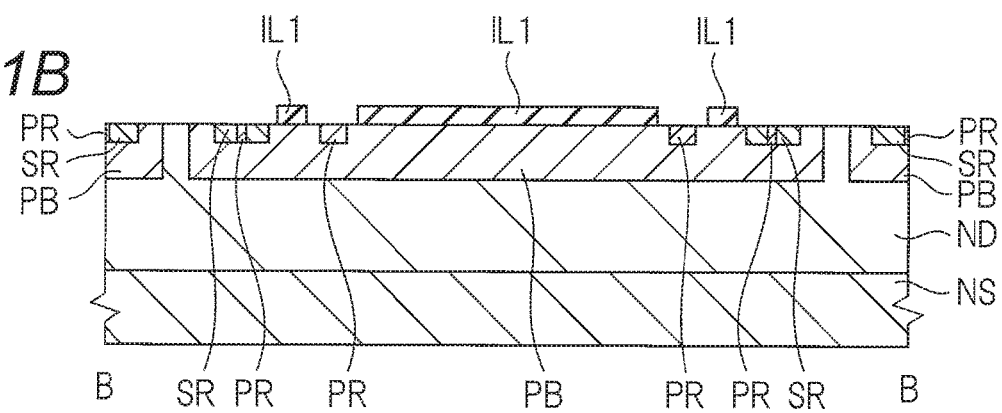
Figure 11C:
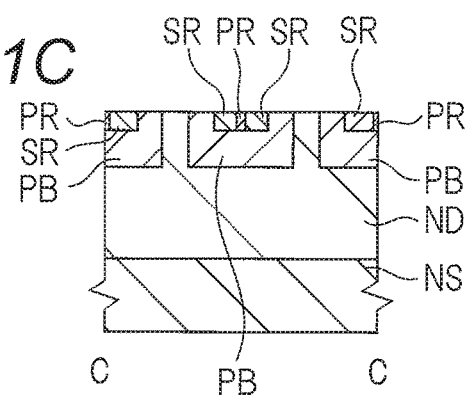

For example, a mask film (not illustrated, for example, a silicon oxide film) having an opening portion in the forming region of the p-type body region PB is formed and the p-type impurity (for example, aluminum (Al)) is ion-implanted. Thereby, the p-type body region PB is formed on an outer periphery of the device region. The depth of the p-type body region PB is, for example, about 0.5 to 2.0 μm from the surface of the n$^-$-type semiconductor layer ND. Further, the impurity concentration of the p-type body region PB is, for example, $1 \times 10^{16}$ to $1 \times 10^{19}$ cm$^{-3}$. As a result, a plurality of the square p-type body regions PB is formed in the device region in the array manner. Further, the rectangular annular p-type body region PB is formed inside the p-type semiconductor region TM. Further, the cross-shaped p-type body region PB is formed to divide the inside of the rectangular annular p-type body region PB into four regions. Further, the p-type body region PB is formed in the region GPA in which the gate pad (GP) is arranged (the region surrounded by the broken line in FIG. 1) (see FIG. 10). A short side (the length in a Y direction) of the region GPA is, for example, about 500 to 2000 μm and a long side (the length in the X direction) of the region GPA is, for example, about 500 to 3000 μm.

Figure 8A:
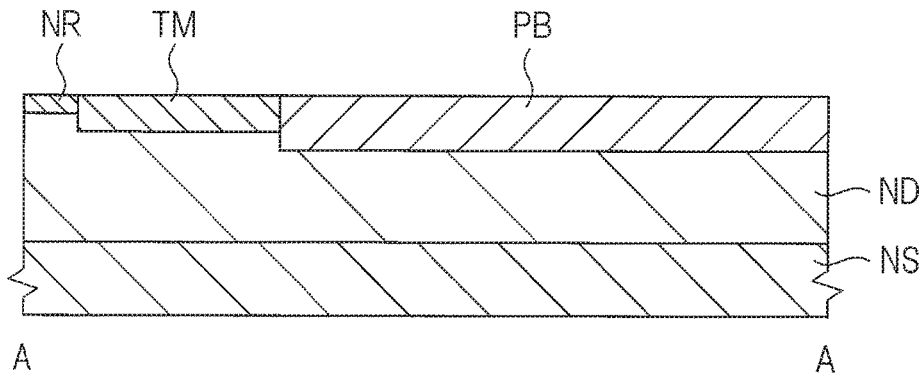
FIGS. 8A to 8C are cross-sectional views illustrating the process of manufacturing the semiconductor device according to the first embodiment.
Figure 8B:
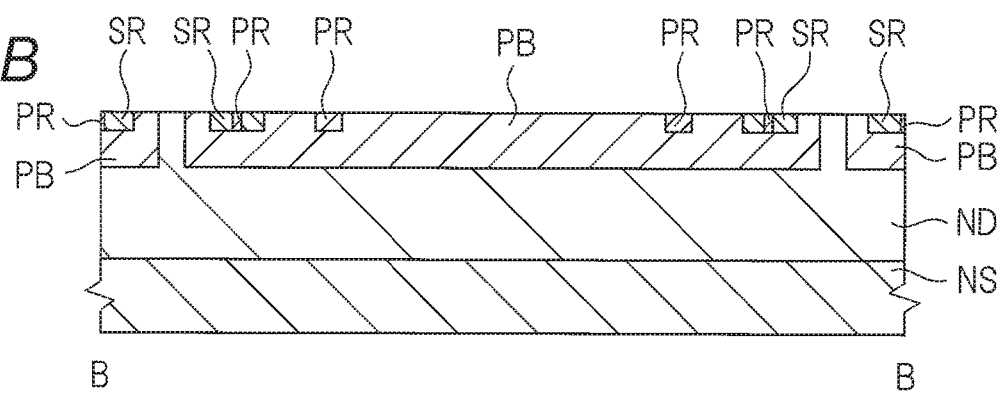
Figure 8C:
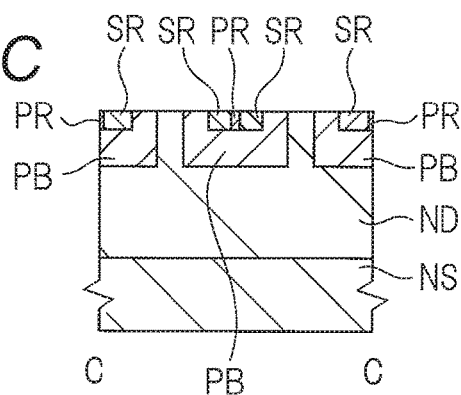
Figure 9A:
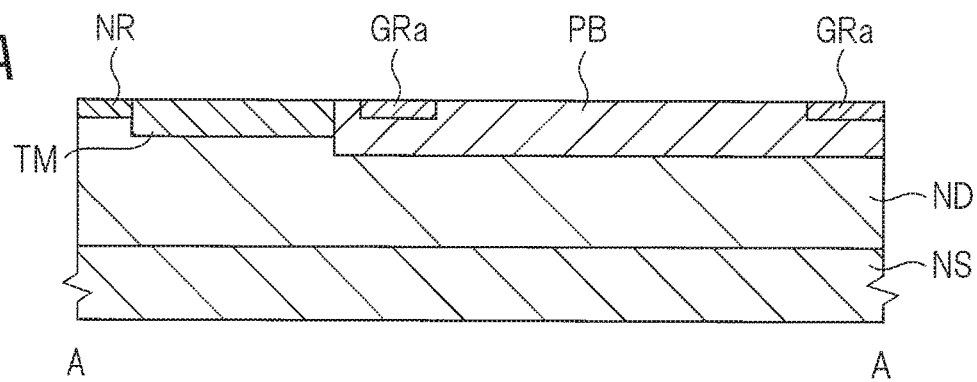
FIGS. 9A to 9C are cross-sectional views illustrating the process of manufacturing the semiconductor device according to the first embodiment.
Figure 9B:
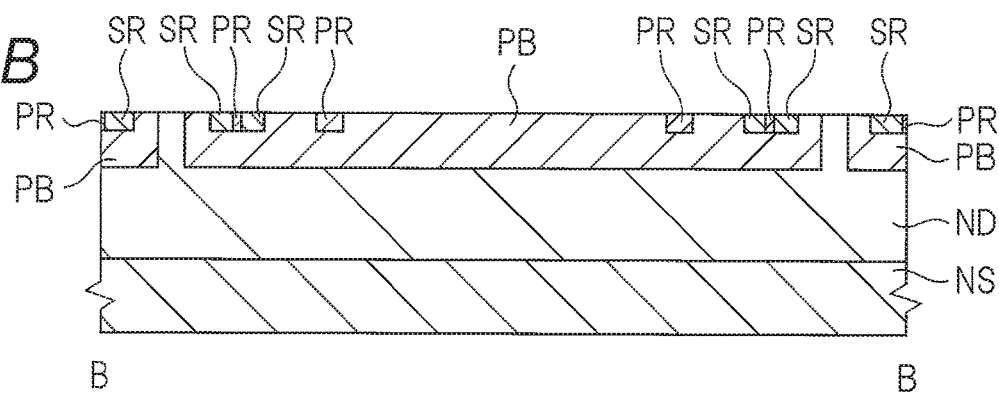
Figure 9C:
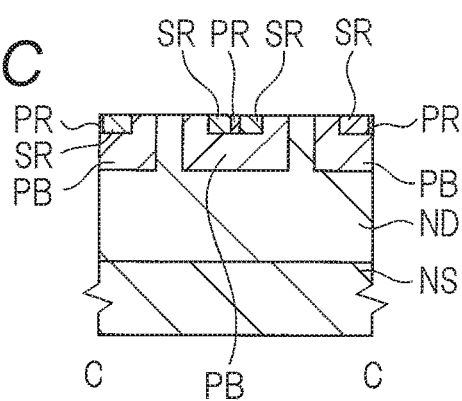

Next, after the mask film is removed, the source region SR is formed in the p-type body region PB in the device region, as illustrated in FIGS. 8A to 8C. Further, at this time, the n$^+$-type semiconductor region NR is formed in an outer periphery of the p-type semiconductor region TM.

For example, the n$^+$-type source region SR and the like are formed by ion-implanting the n-type impurity (for example, nitrogen (N)), using a mask film (not illustrated) having openings in the forming regions of the source region SR and the n$^+$-type semiconductor region NR as a mask. The source regions SR are formed, for example, in an array manner in the device region. The source region SR is formed in a central portion of the substantially square p-type body region PB in plan view (see FIG. 10). The depth of the source region SR and the like from the upper surface of the n$^-$-type semiconductor layer ND is, for example, about 0.05 to 1.0 μm. Further, the impurity concentration of the source region SR and the like is, for example, $1 \times 10^{18}$ to $1 \times 10^{20}$ cm$^{-3}$.

Next, after the mask film is removed, the p$^+$-type semiconductor region PR is formed inside the source region SR in the device region, as illustrated in FIGS. 9A to 9C and FIGS. 10A to 10C. The p$^+$-type semiconductor region PR serves as a contact region between the source electrode SE and the source region SR. For example, the p$^+$-type semiconductor region PR is formed by ion-planting the p-type impurity (for example, aluminum (Al)), using a mask film (not illustrated) having an opening in the forming region of the p$^+$-type semiconductor region PR as a mask. Further, in the ion implantation process, the annular p$^+$-type semiconductor region GRa is formed in the p-type body region PB in the outer periphery of the device region, and the cross-shaped p$^{+\prime}$-type semiconductor region GRb is formed in the cross-shaped p-type body region PB in the device region. Further, in the ion implantation process, the p$^+$-type semiconductor region PR is formed in the p-type body region PB of the region GPA and in an outer peripheral portion (end portion) of the region GPA. The plug provided in the contact hole C1PB described below is formed on the p$^+$-type semiconductor region PR, and the p-type body region PB in the region GPA is connected to the source electrode SE via the plug and the p$^+$-type semiconductor region PR. In other words, the source potential is supplied to the p-type body region PB in the region GPA via the plug and the p$^+$-type semiconductor region PR. The plug in the contact hole C1PB is also called well contact (see FIG. 18B).

Figure 28:
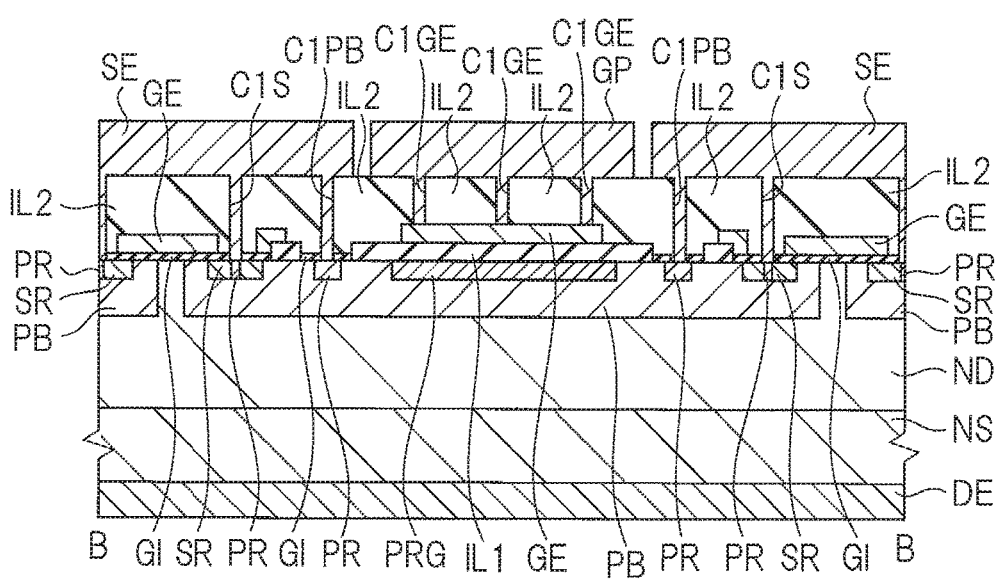
FIG. 28 is a cross-sectional view of a semiconductor device provided with a p$^+$-type semiconductor region below a region GPA.

Note that the p$^+$-type semiconductor region (PRG) may be separately formed in a central portion of the region GPA (see FIG. 28).

The depth of the p$^+$-type semiconductor regions PR, GRa, GRb, and the like from the upper surface of the n$^-$-type semiconductor layer ND is, for example, about 1 μm. Further, the impurity concentration of the p$^+$-type semiconductor regions PR, GRa, GRb, and the like is, for example, $1 \times 10^{18}$ to $1 \times 10^{20}$ cm$^{-3}$. As described above, the p$^+$-type semiconductor regions PR, GRa, GRb, and the like are formed in the same layer, that is, in the same ion implantation process, and are regions having the same degree of impurity concentration. Note that these regions may be formed in separate processes, and the impurity concentration may be changed as required. However, the number of masks can be reduced by forming the regions in the same layer, and the semiconductor device can be manufactured in a short process.

Next, the n-type impurity (for example, nitrogen (N)) is ion-implanted into a back surface of the SiC substrate NS to form a drain region (not illustrated). The depth of the drain region from the back surface of the SiC substrate NS is, for example, about 0.05 to 2.0 μm. Further, the impurity concentration of the drain region is $1 \times 10^{19}$ to $1 \times 10^{21}$ cm$^{-3}$.

Next, a carbon (C) film is formed on the upper surface of the n$^-$-type semiconductor layer ND and the back surface of the SiC substrate NS and heat treatment is applied to activate the impurities ion-implanted on the upper portion of the n$^-$-type semiconductor layer ND and the back surface of the SiC substrate NS. For example, the carbon (C) film is deposited by a plasma chemical vapor deposition (CVD) method. The thickness of the carbon (C) film is, for example, about 0.03 to 0.05 μm. After the upper surface of the n$^-$-type semiconductor layer ND and the back surface of the SiC substrate NS are coated with the carbon (C) film, the heat treatment is applied at the temperature of 1500 degrees or more for 2 to 3 minutes. Thereafter, the carbon (C) film is removed by, for example, plasma treatment.

Next, as illustrated in FIGS. 11A to 11C and FIG. 12, the insulating film (field insulating film) IL1 is formed on the n$^-$-type semiconductor layer ND. For example, as the insulating film (field insulating film) IL1, a silicon oxide film is formed by the CVD method. Here, the thickness of the insulating film (field insulating film) IL1 is 0.7 μm or more, and more favorably 1.5 μm or more. Further, the upper limit of the thickness of the insulating film (field insulating film) IL1 is favorably 3 μm or less from the viewpoint of production efficiency.

Next, the insulating film (field insulating film) IL1 is etched using the mask film with the subcell regions (SCA) open as a mask. As a result, the opening portions OA (SC) corresponding to the subcell regions (SCA) are formed (FIG. 12). That is, the insulating film (field insulating film) IL1 remains in the peripheral region, the region where the gate pad (GP) is arranged (the region GPA surrounded by the broken line in FIG. 10), and the cross-shaped p$^+$-type semiconductor region GRb. That is, the subcell regions SCA are the device region not covered with the insulating film (field insulating film) IL1. In the etching of the insulating film (field insulating film) IL1, the insulating film (field insulating film) IL1 in the forming regions of contact holes C1PB and C1GR described below is etched. With the etching, the opening portion OA (C1PB) is formed in the forming region of the contact hole C1PB, and the opening portion OA (C1GR) is formed in the forming region of the contact hole C1GR. By etching the insulating film (field insulating film) IL1 in the forming regions of the contact holes C1PB and C1GR in advance, a surface step that may hinder a photolithography step at the formation of the contact holes C1PB and C1GR can be eased and pattern processing accuracy can be improved.

Figure 13A:
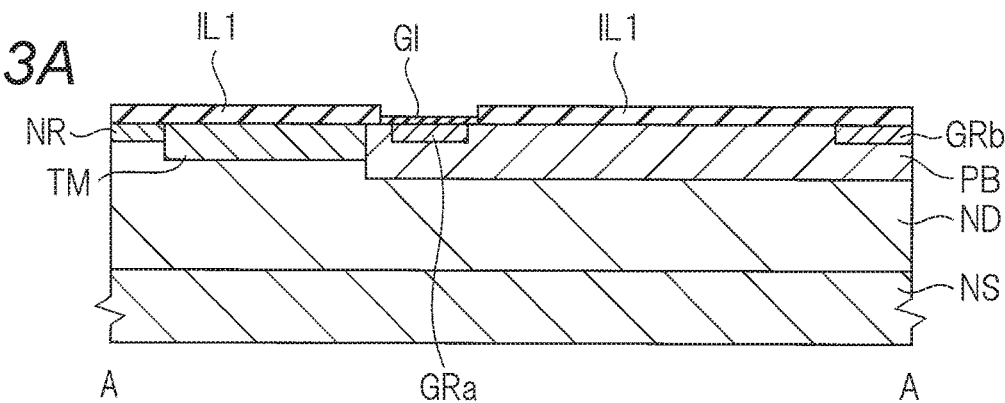
FIGS. 13A to 13C are cross-sectional views illustrating the process of manufacturing the semiconductor device according to the first embodiment.
Figure 13B:
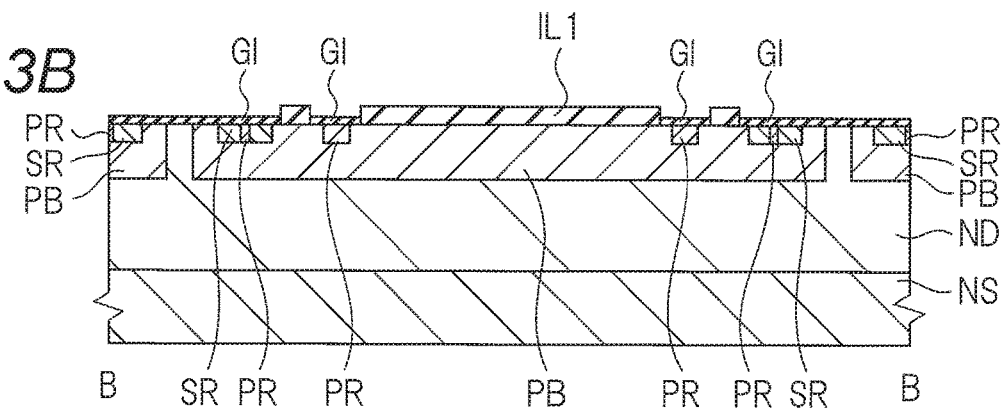
Figure 13C:
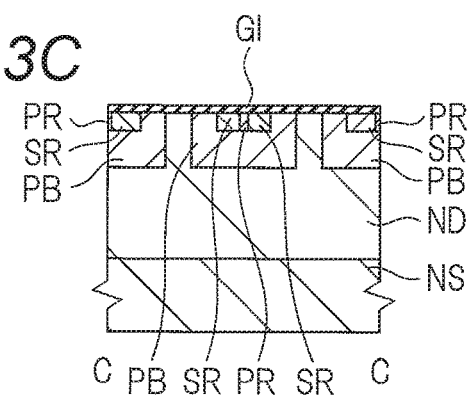
Figure 14A:
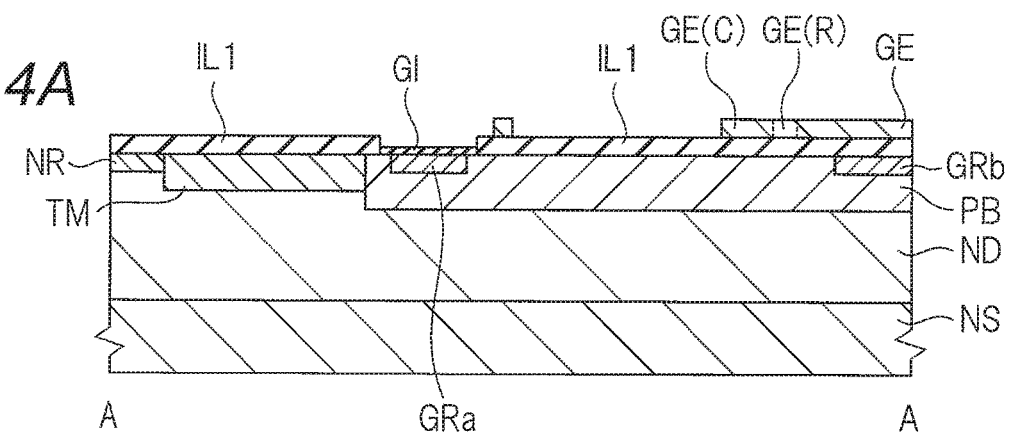
FIGS. 14A to 14C are cross-sectional views illustrating the process of manufacturing the semiconductor device according to the first embodiment.
Figure 14B:
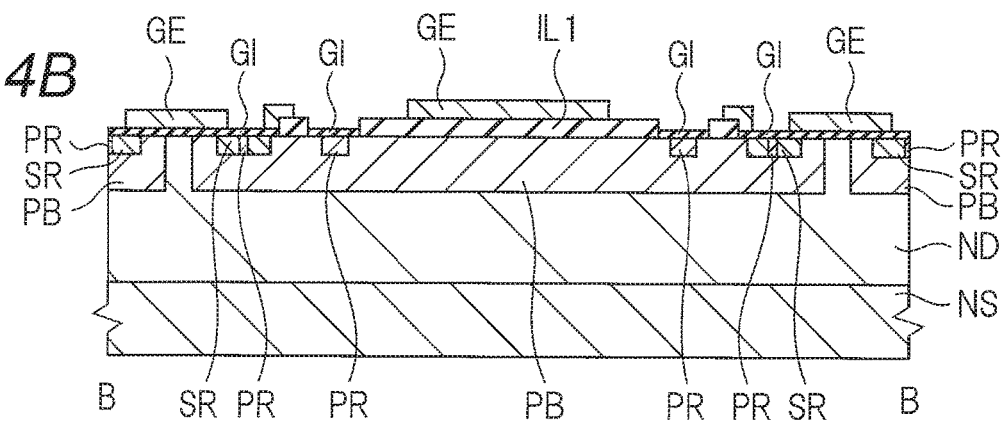
Figure 14C:
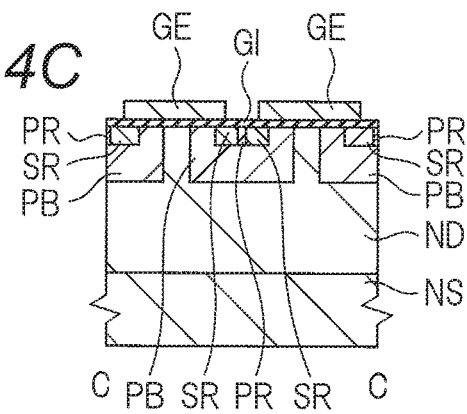

Next, as illustrated in FIGS. 13A to 13C, the gate insulating film GI is formed. For example, a silicon oxide film to serve as the gate insulating film GI is formed by thermal oxidation, for example, on the n$^-$-type semiconductor layer (the drift layer, the p-type body region PB, the p$^+$-type semiconductor region PR, and the source region SR) ND. As the gate insulating film GI, the silicon oxide film may be deposited by the CVD method. The thickness of the gate insulating film GI is, for example, about 0.03 to 0.15 μm.

Figure 15:
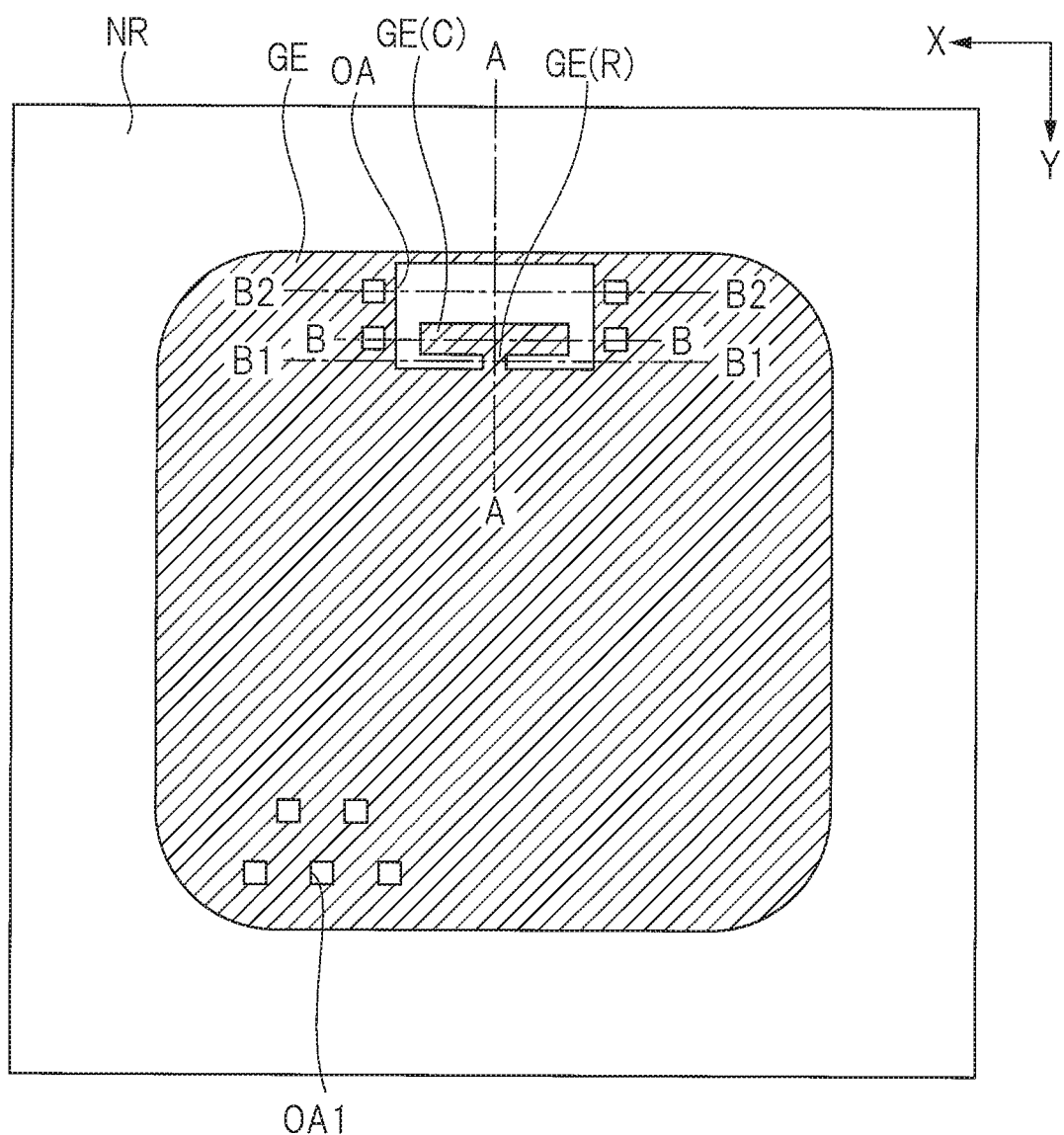
FIG. 15 is a plan view illustrating the process of manufacturing the semiconductor device according to the first embodiment.

Next, as illustrated in FIGS. 14A to 14C and FIG. 15, the gate electrode GE is formed on the p-type body region PB adjacent to and on between the source regions SR via the gate insulating film GI. Here, the gate electrode GE is formed on between the source regions SR via the gate insulating film GI. Since the connection portion embedded in the contact hole C1S to be described below is arranged near the source region SR, the gate electrode GE is processed to have an opening portion OA1 in a region including the forming region of the connection portion (FIG. 15). At this time, an opening portion OA1 is also formed in the forming region of the contact hole C1PB. Further, the gate electrode GE remains on the cross-shaped p$^+$-type semiconductor region GRb and is not arranged on the annular p$^+$-type semiconductor region GRa. Note that the gate electrode GE may also be arranged on the annular p$^+$-type semiconductor region GRa.

For example, the conductive film to serve as the gate electrode GE is deposited on the n$^-$-type semiconductor layer (the drift layer, the p-type body region PB, the p$^+$-type semiconductor region PR, and the source region SR) ND and the insulating film (field insulating film) IL1 via the gate insulating film GI. Here, a polycrystalline silicon film is deposited on the gate insulating film GI as the gate electrode GE by the CVD method. Next, a mask film that covers a region where the gate electrode GE is to remain is formed, and the polycrystalline silicon film is etched using the film as a mask (FIGS. 14A to 14C and FIG. 15). The thickness of the gate electrode GE is, for example, about 0.2 to 0.5 μm.

Here, in the present embodiment, the resistance portion GE(R) and the connection portion GE(C) are formed in the region GPA in the etching of the conductive film to serve as the gate electrode GE (FIG. 15). The opening portion OA is provided in the region GPA and is patterned to have the resistance portion GE(R) and the connection portion GE(C) arranged therein (FIG. 15).

Figure 16A:
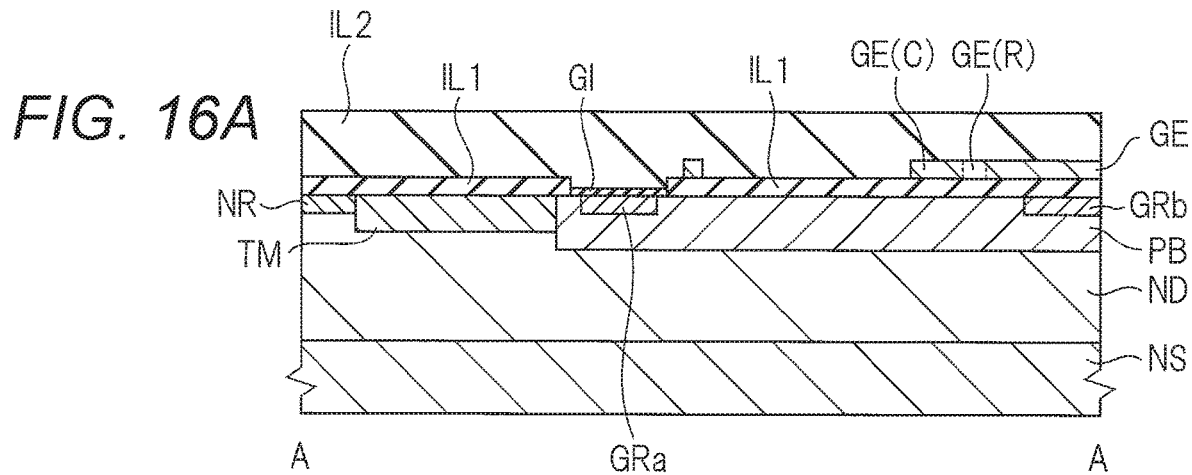
FIGS. 16A to 16C are cross-sectional views illustrating the process of manufacturing the semiconductor device according to the first embodiment.
Figure 16B:
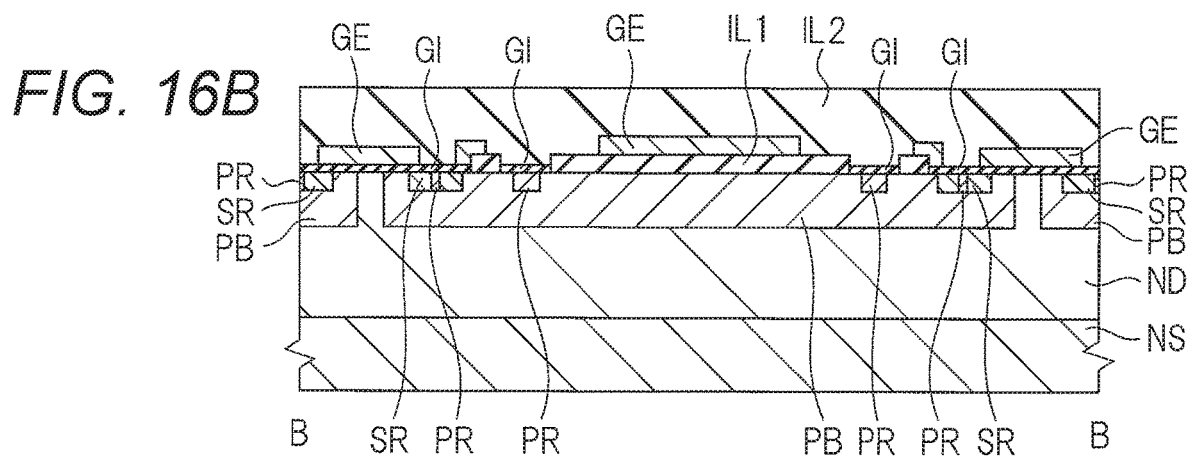
Figure 16C:
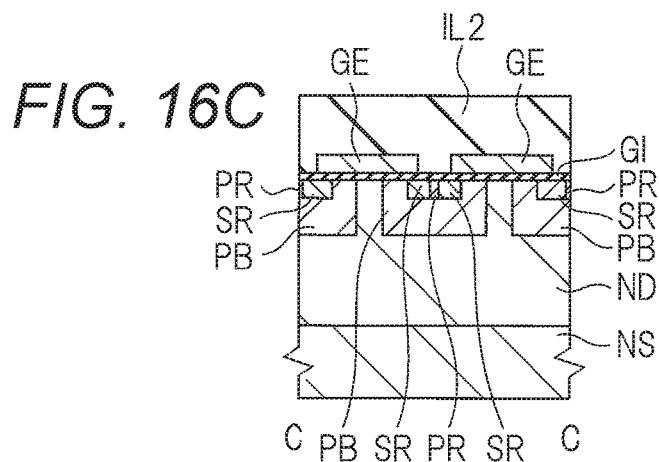

Next, after the mask film is removed, the insulating film (interlayer insulating film) IL2 is formed, as illustrated in FIGS. 16A to 16C. For example, a silicon oxide film is formed on the gate electrode GE, the gate insulating film GI, and the insulating film (field insulating film) IL1 by the plasma CVD method.

Figure 17A:
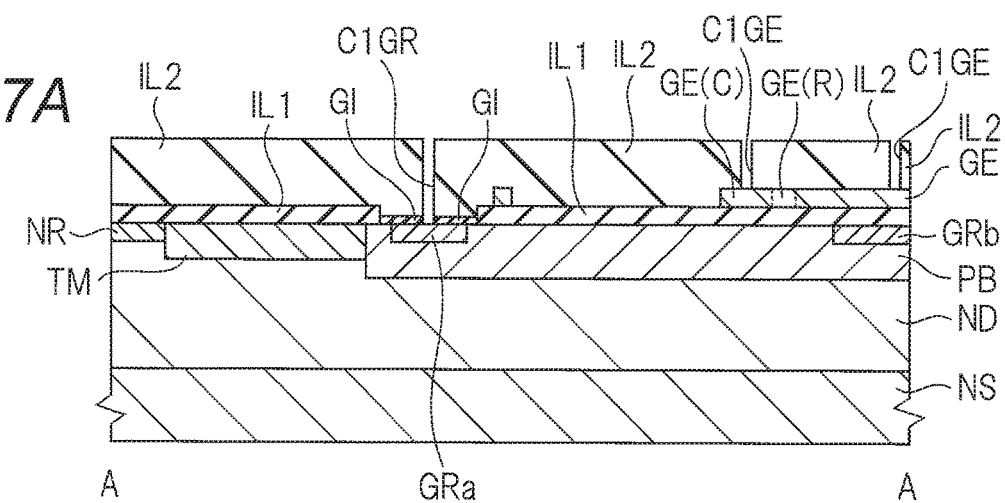
FIGS. 17A to 17C are cross-sectional views illustrating the process of manufacturing the semiconductor device according to the first embodiment.
Figure 17B:
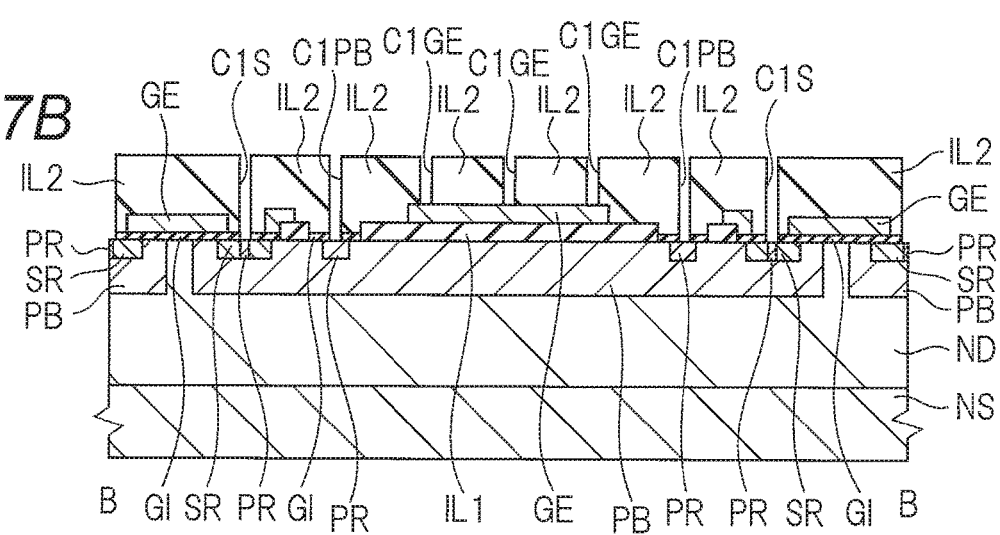
Figure 17C:
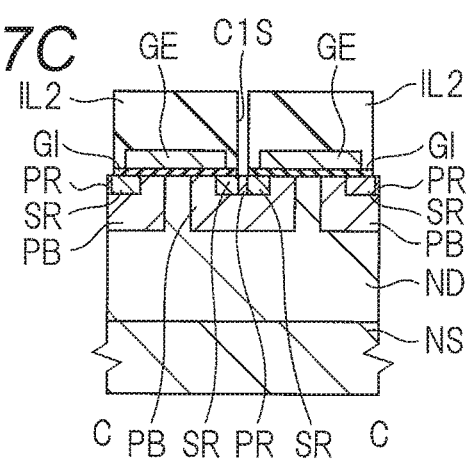

Next, the contact holes (C1S, C1GR, C1GE, and C1PB) are formed in the insulating film (interlayer insulating film) IL2, as illustrated in FIGS. 17A to 17C. For example, a mask film (not illustrated) having opening portions in the forming regions of the contact holes (C1S, C1GR, C1GE, and C1PB) is formed on the insulating film (interlayer insulating film) IL2, and the insulating film (interlayer insulating film) IL2 is etched using the film as a mask.

Thereby, the contact hole C1S is formed on the source region SR, and the contact hole C1GR is formed on the annular $p^+$-type semiconductor region GRa. Further, in the above etching process, the contact hole C1GE is formed on the gate electrode GE and the contact hole C1PB reaching the p-type body region PB is formed in the vicinity of the region GPA (see FIG. 3). The contact hole C1S has a substantially quadrangular shape, and the contact holes C1S are arranged in the cell region in an array manner. The contact hole C1GR is annularly arranged on the annular $p^+$-type semiconductor region GRa. The contact hole C1GE is arranged on the gate electrode GE in the region (GPA) in which the gate pad (GP) is arranged. Note that the contact hole C1GE may also be formed on the cross-shaped gate electrode (finger electrode) GE. The shape (planar shape) of the contact hole may be a substantially quadrangular shape or a line shape along the electrode.

Figure 18A:
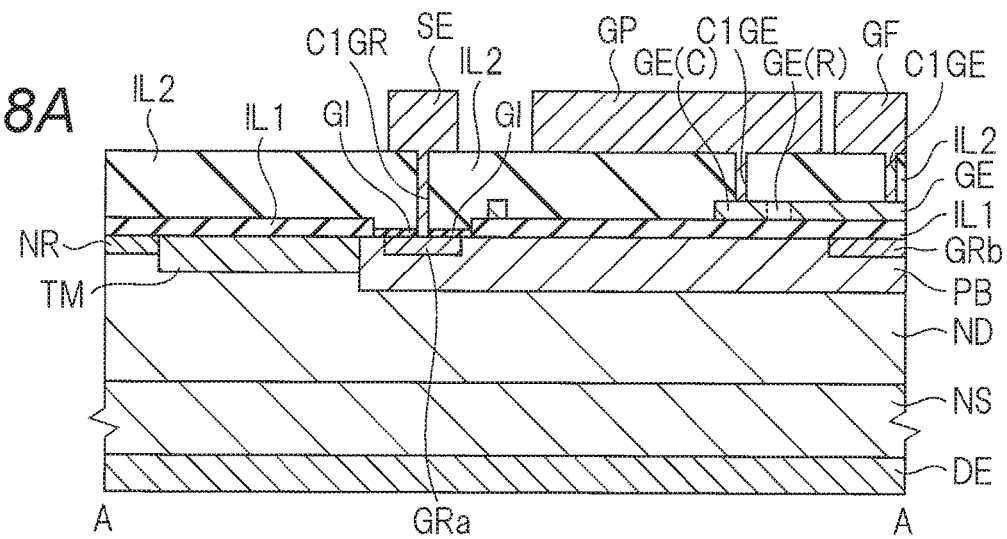
FIGS. 18A to 18C are cross-sectional views illustrating the process of manufacturing the semiconductor device according to the first embodiment.
Figure 18B:
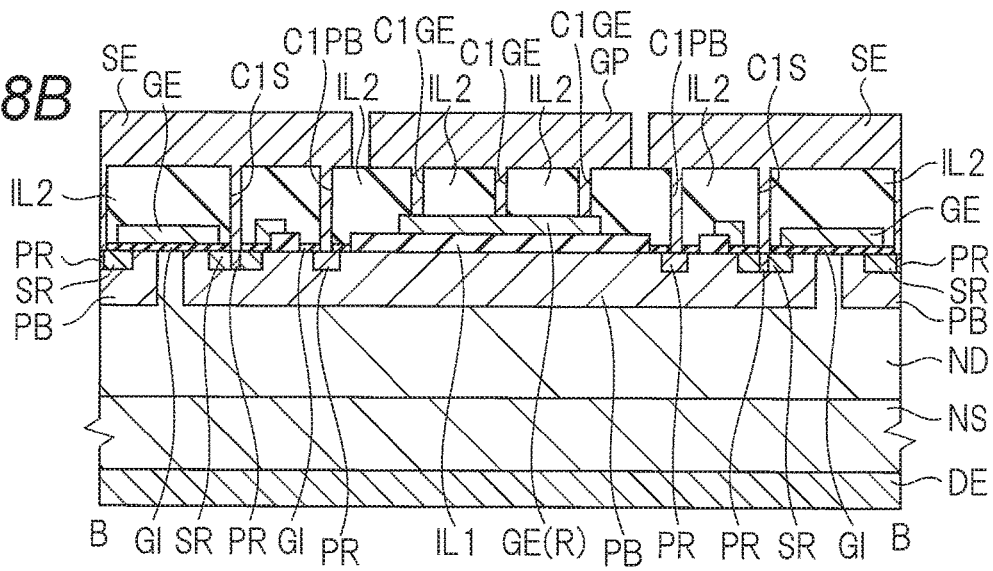
Figure 18C:
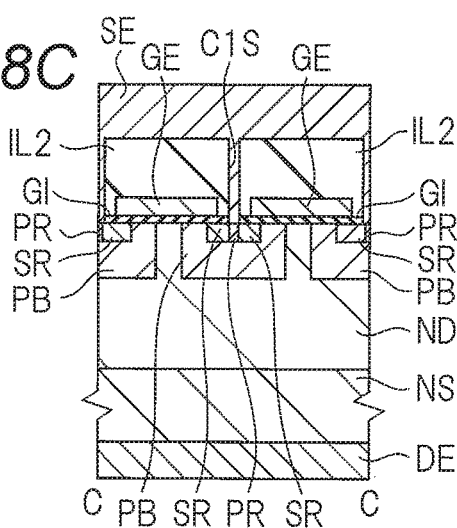

Next, after the mask film (not illustrated) is removed, the source electrode SE the gate pad GP, and the gate finger GF are formed, as illustrated in FIGS. 18A to 18C. First, the conductive film to serve as the source electrode SE and the gate pad GP is formed on the insulating film (interlayer insulating film) IL2 including the contact hole C1 (C1S, C1GR, C1GE, and C1PB). For example, a laminated film of Ti/TiN/Al/TiN/Al is formed as the conductive film. For example, these films are sequentially deposited using a sputtering method or the like. Next, the conductive film is etched using a mask film (not illustrated) covering the forming regions of the source electrode SE, the gate pad GP, and the gate finger GF, as a mask, to form the source electrode SE, the gate pad GP, and the gate finger GF (see FIGS. 18A to 18C and FIG. 3). The source electrode SE is arranged to cover the subcell regions and the annular $p^+$-type semiconductor region (GRa). Further, the gate pad GP is arranged in a substantially rectangular shape in an end portion of the cell region. Further, the gate finger GF is arranged in a cross shape between the subcell regions.

As a result, the source electrode SE and the source region SR are connected by the plug made of the conductive film and embedded in the contact hole C1S, and the source electrode SE and the annular $p^+$-type semiconductor region GRa are connected by the plug made of the conductive film and embedded in the contact hole C1GR. Further, the gate pad GP and the gate electrode GE are connected by the plug made of the conductive film and embedded in the contact hole C1GE. As a result, the gate pad GP and the gate electrode GE are connected via the resistance portion GE(R). Further, the gate finger GF and the gate electrode GE are connected by the plug made of the conductive film and embedded in the contact hole C1GE. To reduce connection resistance between these plugs and lower layer regions, a metal silicide film may be formed under the plugs.

Next, the mask film (not illustrated) is removed, and a protective film (not illustrated) is formed on the source electrode SE, the gate pad GP, and the gate finger GF, and the protective film is etched to provide opening portions on the source electrode SE and the gate pad GP. The opening portion serves as a pad portion (external connection portion).

For example, an $SiO_2$ film or a polyimide film is formed on the source electrode SE, the gate pad GP, and the gate finger GF as the protective film (passivation film), and a part of the protective film is removed using an etching technology, to form the pad portion.

Next, a drain electrode DE is formed on the back surface of the SiC substrate NS. For example, a laminated film of Ti/Ni/Au (total film thickness of 0.5 to 1 μm) is sequentially deposited on the back surface of the SiC substrate NS, using a sputtering method or the like, to form the drain electrode DE. Note that a metal silicide film may be formed between the SiC substrate NS and the drain electrode DE.

Thereafter, the SiC substrate NS is cut into individual pieces in a dicing step, whereby a plurality of semiconductor chips can be obtained.

Through the above process, the semiconductor device of the present embodiment can be formed. Note that the above process is an example, and the semiconductor device of the present embodiment may be manufactured by a process other than the above process. Further, the planar shape and forming position of each region may be appropriately changed. For example, the gate pad GP may be provided in a central portion of the cell region. Further, two or more layers of wiring may be provided above the gate electrode GE.

According to the semiconductor device of the present embodiment, the film thickness of the insulating film (field oxide film) IL1 is set to 0.7 μm or more, whereby the breakdown of the insulating film (field oxide film) IL1 can be suppressed even if the surge voltage occurs, as described below. Further, even in the case of the configuration in which the opening portion OA is provided in the gate electrode GE below the gate pad GP by setting the film thickness of the insulating film (field oxide film) IL1 to 1.5 μm or more, the breakdown of the insulating film (field oxide film) IL1 can be suppressed.

Hereinafter, effects of the present embodiment will be described.

1) Occurrence of Surge Voltage

Figure 19:
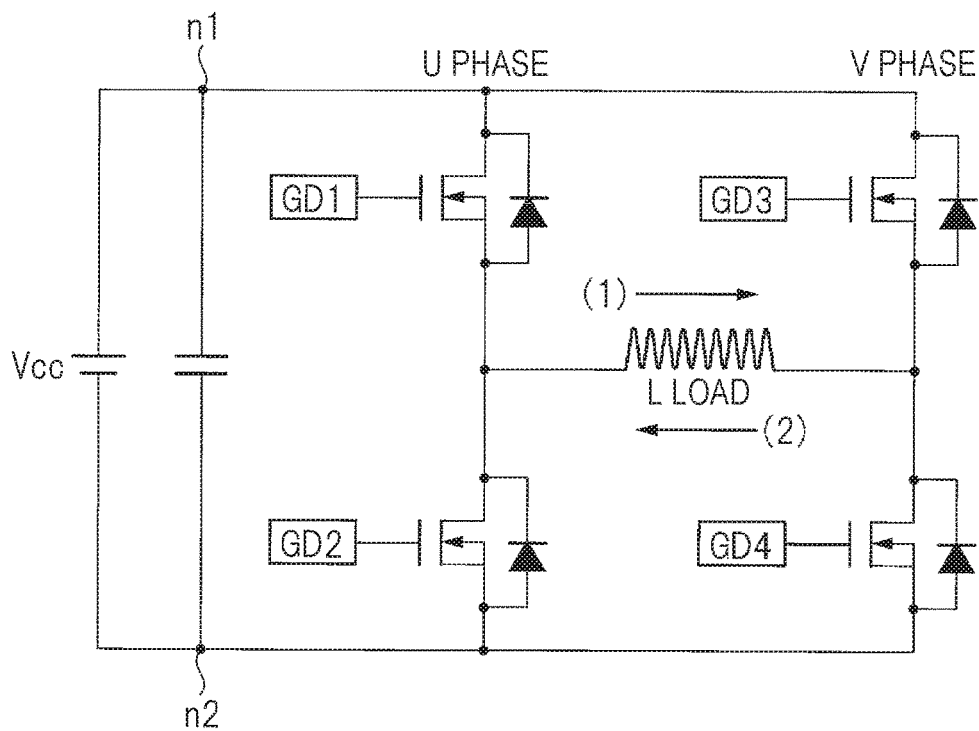
FIG. 19 is an inverter circuit diagram.

FIG. 19 is an inverter circuit diagram. This circuit is an inverter circuit that converts DC to AC.

This circuit includes two MOSFETs (GD1 and GD2) connected in series between a first node n1 and a second node n2, and two MOSFETs (GD3 and GD4) connected in series between the first node n1 and the second node n2, and an L load is connected between connection portions of the MOSFETs. Further, a power supply Vcc is connected between the first node n1 and the second node n2, and furthermore, a capacitor is connected between the first node n1 and the second node n2.

When an ON signal is input to the MOSFETs GD1 and GD4 and an OFF signal is input to the MOSFETs GD2 and GD3, among the four MOSFETs (GD1 to GD4), a current in a direction (1) flows in the L load. Conversely, when the off signal is input to the MOSFETs GD1 and GD4 and the on signal is input to the MOSFETs GD2 and GD3, a current in a direction (2) flows in the L load. The DC (direct current) can be converted from several Hz to the AC (alternating current) of several kHZ by repeatedly switching inputs of the ON and OFF signals.

Figure 20:
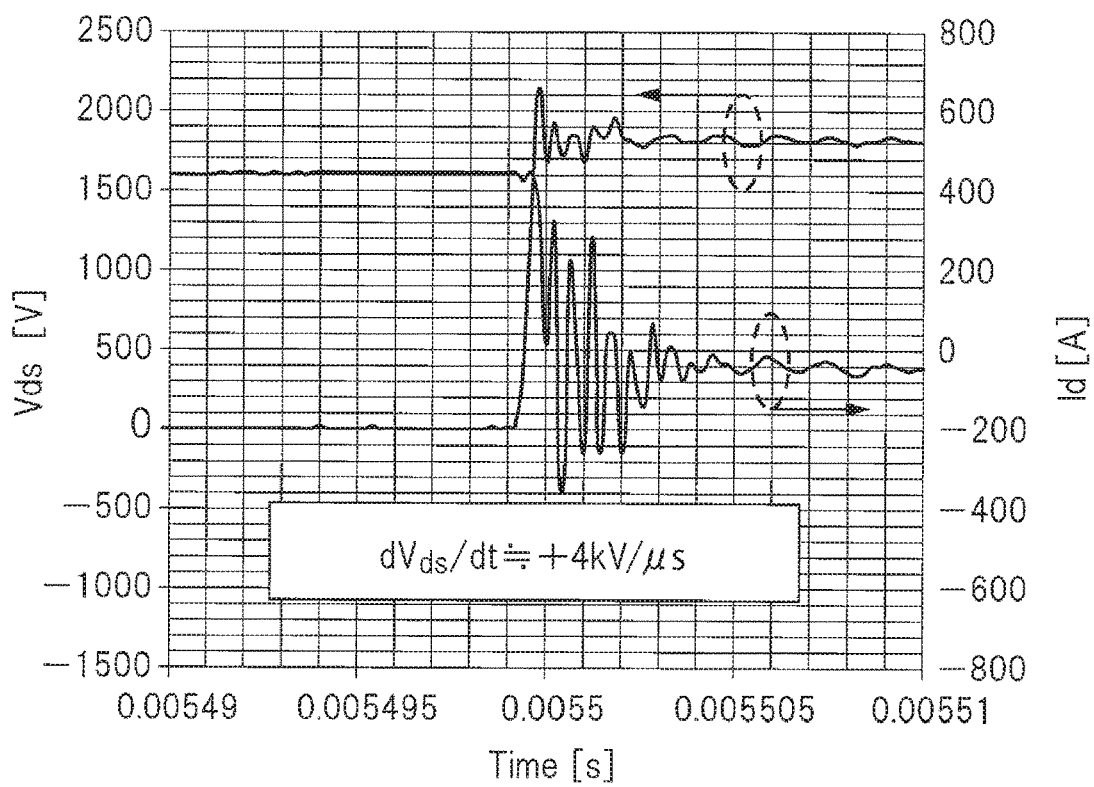
FIG. 20 is a diagram illustrating an example of current/voltage waveforms at the time of switching MOSFETs constituting an inverter.

FIG. 20 is a diagram illustrating an example of current/voltage waveforms at the time of switching the MOSFETs constituting the inverter. Here, the waveforms when the MOSFETs are switched from ON to OFF are illustrated. The vertical axis on the left side represents a drain voltage (Vds [V]), the vertical axis on the right side represents a drain current (Id [A]), and the horizontal axis represents a time (Time [s]).

As illustrated in FIG. 20, when the MOSFETs are switched from ON to OFF, the drain current in the MOSFETs is rapidly changed from 400 A to zero, and the drain voltage is change from zero to 1800 V at the same time. A voltage change speed (dVds/dt) at this time reaches about 4 kV/µs.

With such sudden voltage change, the surge voltage can occur in the semiconductor region. As illustrated in FIG. 20, the drain voltage that needs to be raised up to 1800 V rises to about 2150 V in a transition period. The relatively thick insulating film (field insulating film) IL1 below the gate pad GP is broken down by such a surge voltage. For example, the insulation breakdown voltage of the insulating film (field insulating film) IL1 is designed to about 200 V. It can be considered that the insulating film (field insulating film) IL1 is broken down by the surge voltage.

2) Simulation of Overvoltage

Figure 21:
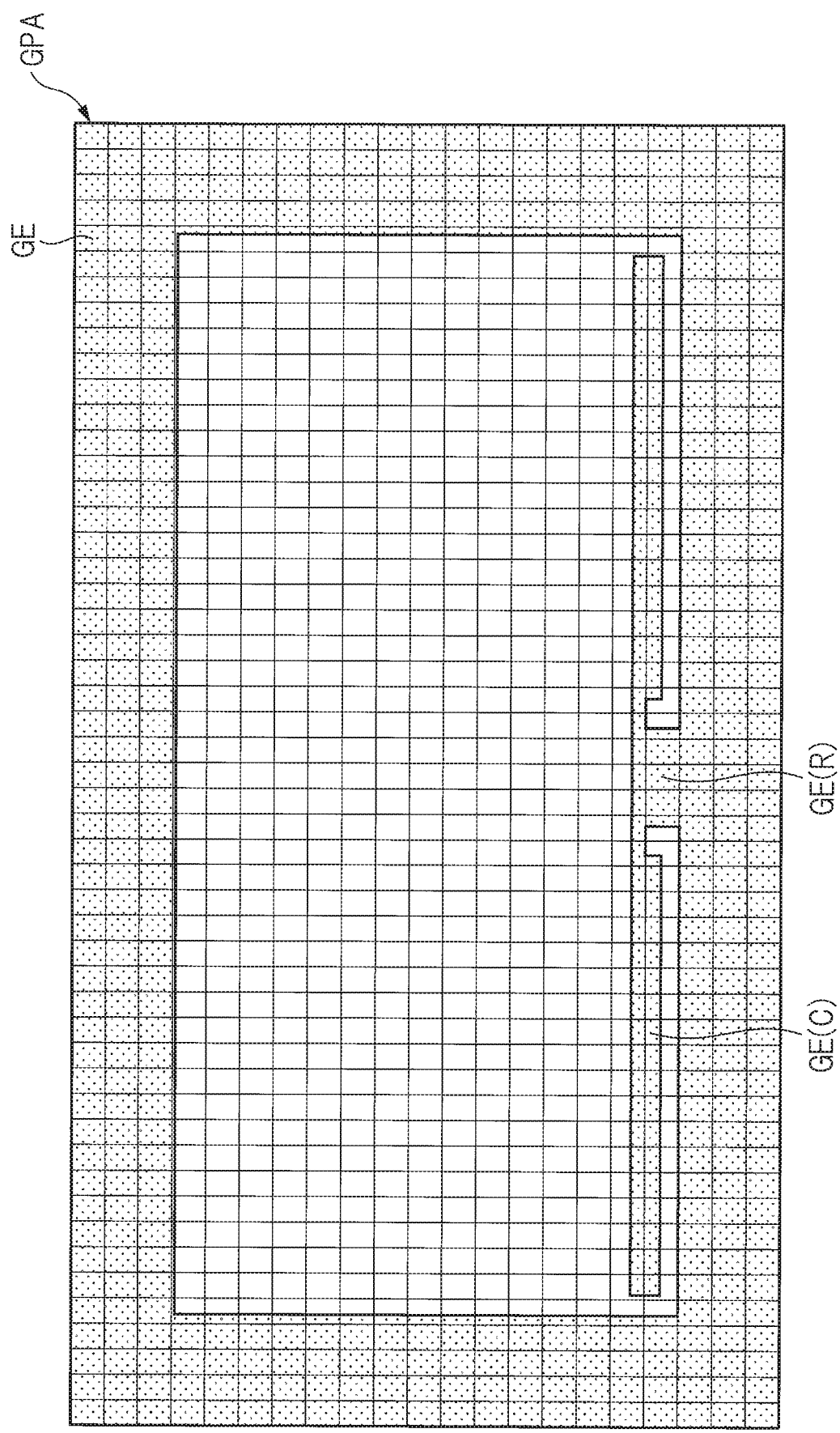
FIG. 21 is a diagram illustrating a divided state of a region where a gate pad is arranged.
Figures 22, 23:
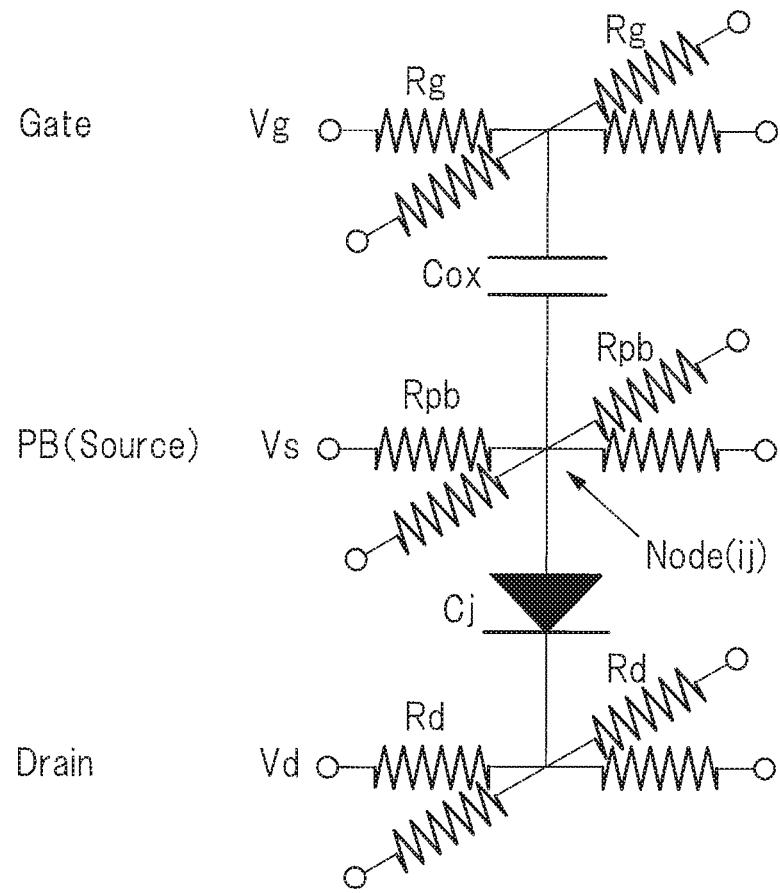
FIG. 22 is a diagram illustrating equivalent circuits of fine regions.
FIG. 23 is a diagram illustrating relational expressions of resistance and capacitance.
Figure 24:
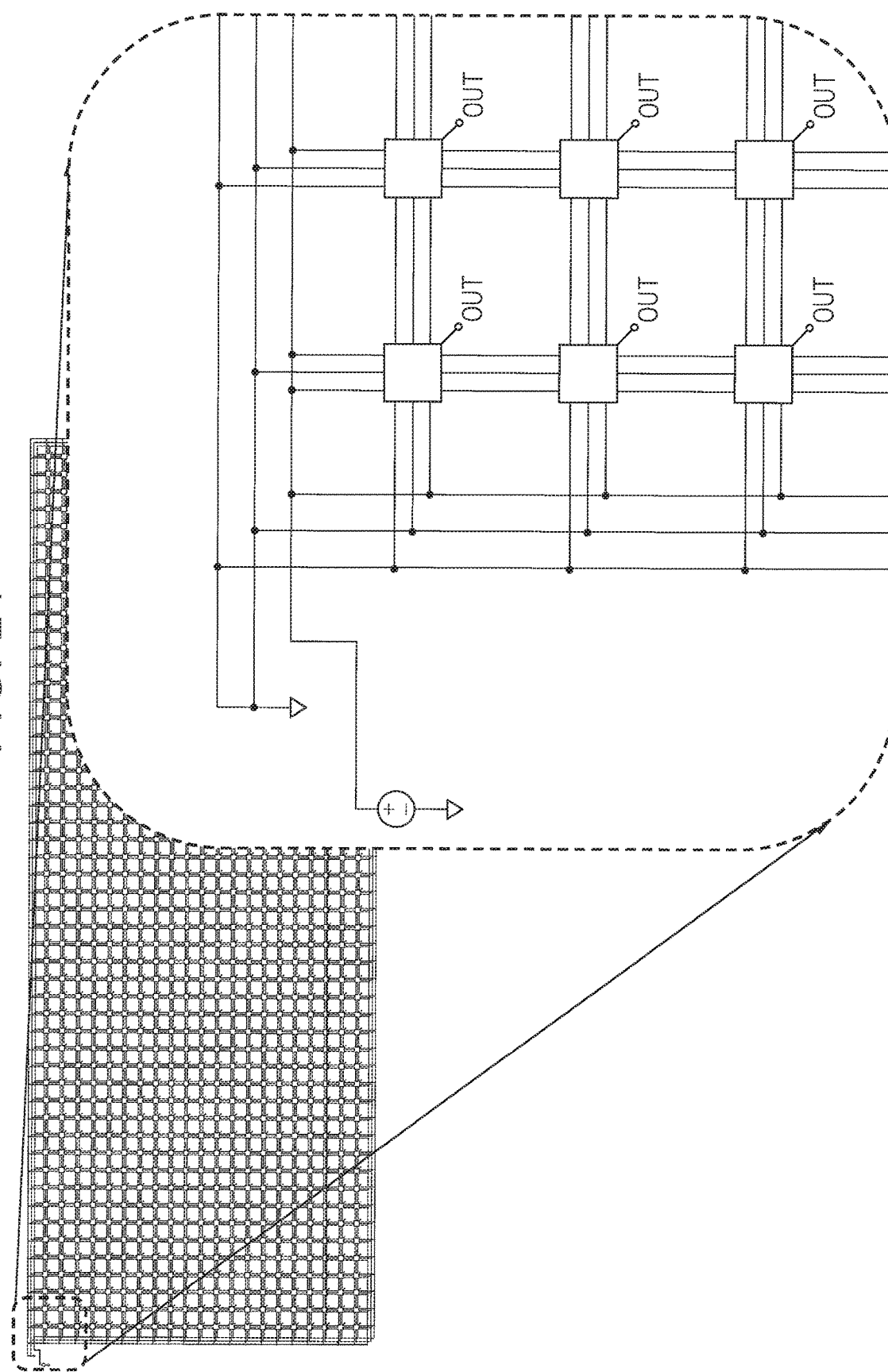
FIG. 24 is a diagram illustrating a connection state of equivalent circuits of fine regions.

FIG. 21 is a diagram illustrating a divided state of a region (a region surrounded by the broken line in FIG. 1) GPA where the gate pad (GP) is arranged. As illustrated in FIG. 21, an equivalent circuit is set to each of fine regions obtained by dividing, for the region GPA, the long side (2.258 mm) into 51 segments and dividing the short side (1.230 mm) into 21 segments, respectively, and the overvoltage in each of the fine regions is simulated. FIG. 22 is a diagram illustrating the equivalent circuits of the fine regions. FIG. 23 illustrates relational expressions of resistance and capacitance. FIG. 24 is a diagram illustrating a connection state of the equivalent circuits of the fine regions.

Figure 25:
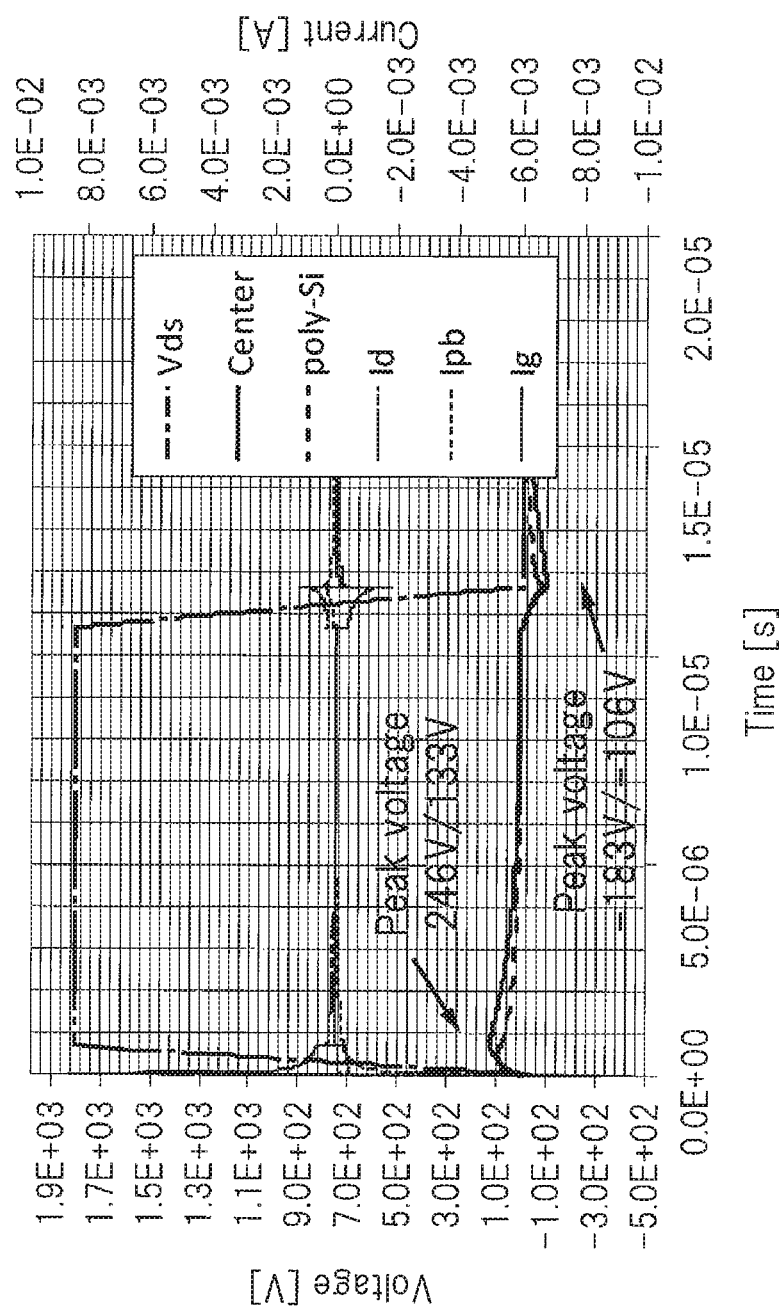
FIG. 25 is a graph illustrating simulation results.

As illustrated in FIGS. 22 to 24, the region where the gate pad (GP) is arranged is made into an equivalent circuit, and the overvoltage that occurs with the switching is calculated by circuit simulation. FIG. 25 is a graph illustrating simulation results, and FIG. 26 is a diagram (table) illustrating simulation conditions. As illustrated in FIG. 26, as the film thickness of the insulating films (oxide films), the insulating film (field) IL1 was set to have 300 nm and the insulating film (inter layer insulator) IL2 was set to have 350 nm. In addition, as the sheet resistance of the regions, the sheet resistance of the p-type body region PB was set to 186 kΩ/□ and the sheet resistance of the p$^+$-type semiconductor region PR was set to 78 kΩ/□. In addition, as the capacitance, PB/n-epi, that is, the capacitance (Cj0) between the p-type body region PB and the n$^-$-type semiconductor layer ND was set to 19.8 nF/cm$^2$, FG/PB, that is, the capacitance (Cox) between the p-type body region PB and the gate residual (floating gate) was set to 11.6 nF/cm$^2$, and Ml/PB, that is, the capacitance (Cox2) between the p-type body region PB and the gate pad GP was set to 5.3 nF/cm$^2$. Note that m=0.53 and Vj=1.7 V. In addition, as the driving conditions, the power supply voltage (Vcc) was 1.8 kV, the voltage change speed (dV/dt (off)) at the off time was 2.8 kV/µs, and the voltage change speed (dV/dt (on)) at the off time was 1.8 kV/µs. The overvoltage was calculated for each of the divided fine regions, using a device simulator using the simulation conditions illustrated in FIG. 26 for the relational expressions illustrated in FIG. 23. In addition, the electric field strength applied to the insulating film (field) IL1 was calculated from the overvoltage and the film thickness of the insulating film (field) IL1.

The vertical axis on the left side in FIG. 25 represents a voltage (Voltage [V]), the vertical axis on the right side represents a current (Current [A]), and the horizontal axis represents a time (Time [s]). As described above, the film thickness of the field insulating film was 300 nm (0.3 µm).

As illustrated in FIG. 25, a peak voltage of 246 V has been confirmed in a central portion (Center) of the region GPA, and a peak voltage of 133 V has been confirmed in an end portion of the region GPA, that is, in a portion (Poly-Si) of the polycrystalline silicon film of the gate electrode GE(R) and GE(C), with the rise (rising at the OFF time) of a source-drain voltage Vds. Further, a peak voltage of −183 V has been confirmed in the central portion (Center) of the region GPA, and a peak voltage of −106 V has been confirmed in the end portion of the region GPA, that is, in the portion (Poly-Si) of the polycrystalline silicon film of the gate electrode GE(R) and GE(C), with the drop (fall at the ON time) of the source-drain voltage Vds. Note that Id represents a drain current, Ipb represents a current flowing in the p-type body region, and Ig represents a gate current. In this way, it has been found that the overvoltage exceeds 200 V. Further, it has been found that the overvoltage is larger in the central portion (Center) than in the end portion of the region GPA.

Further, it has been found that the electric field strength in the central portion (Center) of the region GPA reaches 7 MV/cm.

Figure 27:
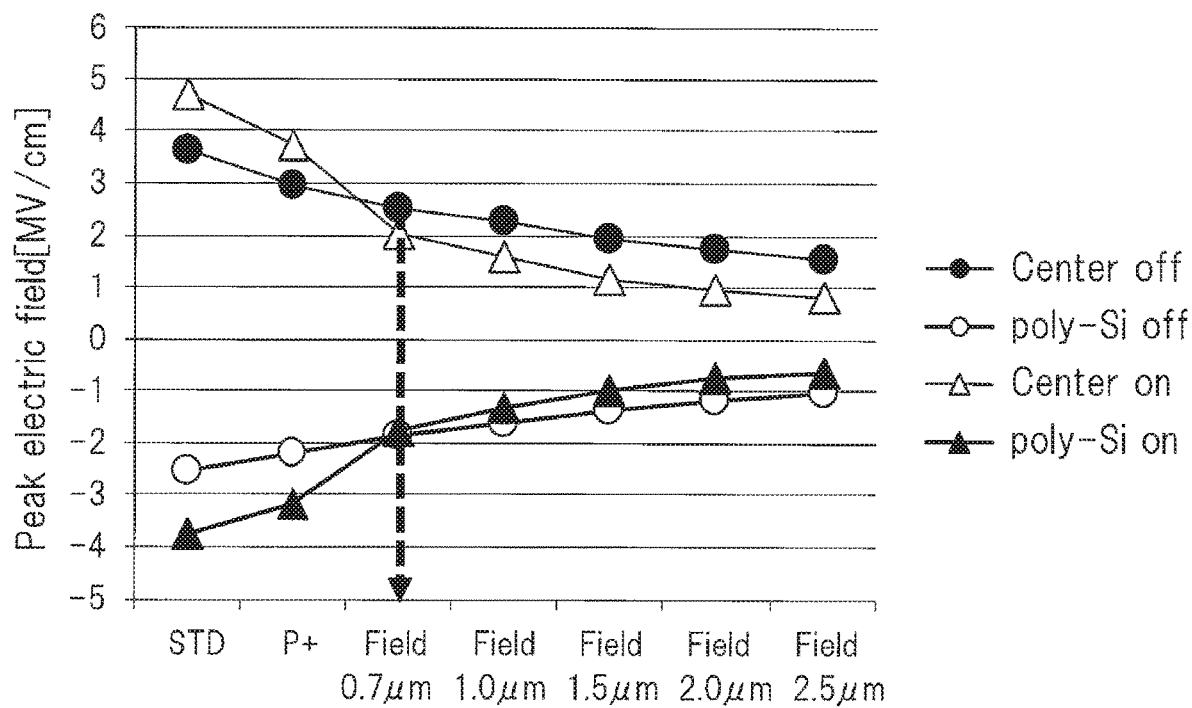
FIG. 27 is a diagram illustrating relationship between film thickness of a field insulating film and electric field strength.

Similar simulation was conducted by changing the thickness of the field insulating film, and the relationship between the film thickness of the field insulating film and the electric field strength was investigated. FIG. 27 is a diagram illustrating the relationship between the film thickness of the field insulating film and the electric field strength. The vertical axis of FIG. 27 represents peak electric field strength [MV/cm], and the horizontal axis represents the film thickness [µm] of the field insulating film. Note that STD represents a case of 0.3 µm, and P+ represents a case of 0.3 µm and a case in which the p$^+$-type semiconductor region PRG is provided in the p-type body region PB below the region GPA as illustrated in FIG. 28. FIG. 28 is a cross-sectional view of the semiconductor device provided with the p$^+$-type semiconductor region PRG below the region GPA. Note that "off" means rise (rising) of the source-drain voltage Vds, and "on" means drop (fall) of the source-drain voltage Vds. Therefore, Center-off represents a graph of the peak electric field strength of the central portion (Center) of the region GPA at the time of rise (rising) of the source-drain voltage Vds.

As illustrated in FIG. 27, the peak electric field strength decreases as the film thickness of the field insulating film increases. When the film thickness of the field insulating film is 0.7 µm or more, the electric field strength becomes 3 MV/cm or less.

3) Influence of Residue of Gate Electrode

Figure 29:
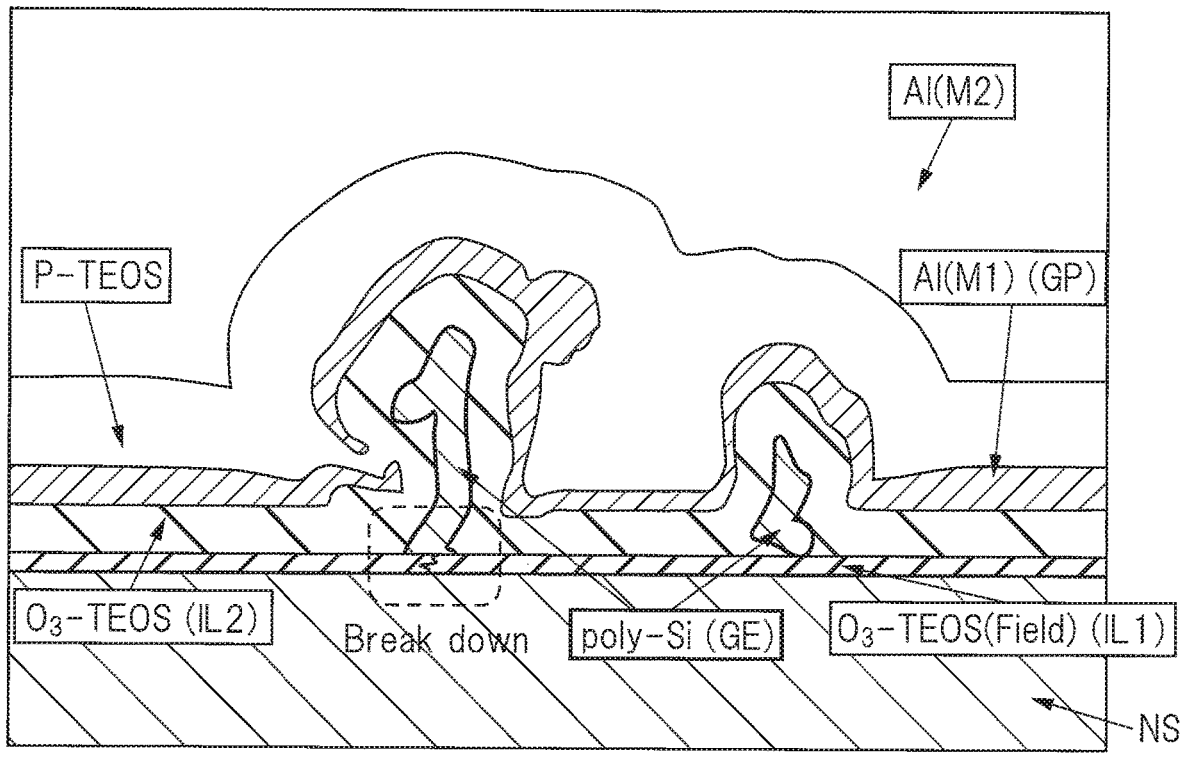
FIG. 29 is a cross-sectional view illustrating a state of a residue of a gate electrode.

According to the studies by the present inventors, the case where the field insulating film is broken down in the opening portion of the gate electrode GE has been confirmed. As a result of an analysis, a residue (defect) of the gate electrode GE as illustrated in FIG. 29 was confirmed. FIG. 29 is a cross-sectional view illustrating a state of the residue of the gate electrode.

As illustrated in FIG. 29, in the case where the residue (poly-Si) of the gate electrode GE occurs on the field insulating film in the opening portion of the gate electrode GE, the overvoltage is large in the central portion of the region GPA, as described above, and thus breakdown occurs between the residue (poly-Si) of the gate electrode GE and the p-type body region PB, and the field insulating film is broke down.

Such a residue of the gate electrode is a pattern of the conductive film in the same potential state as a floating or gate electrode, and detection by electrical inspection is difficult. Therefore, a device configuration capable of suppressing the breakdown of the field insulating film even if the residue of the gate electrode occurs is favorable.

Figure 30:
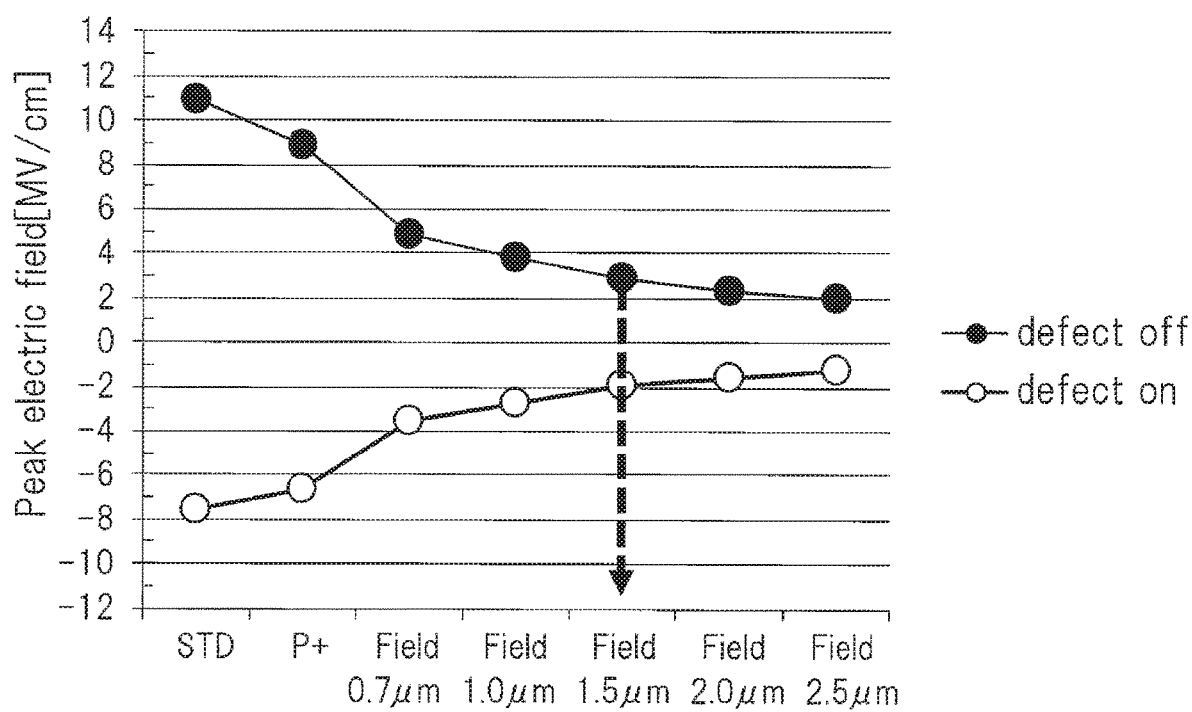
FIG. 30 is a diagram illustrating relationship between film thickness of a field insulating film and electric field strength.

Therefore, simulation was performed similarly to 2) above, assuming that the pattern of the conductive film in the floating state remains in the opening portion of the conductive film constituting the gate electrode GE. FIG. 30 is a diagram illustrating relationship between the film thickness of the field insulating film and the electric field strength. The vertical axis in FIG. 30 represents peak electric field strength [MV/cm], and the horizontal axis represents the film thickness [μm] of the field insulating film. Note that STD represents a case of 0.3 μm, and P+ represents a case of 0.3 μm and a case in which the $p^+$-type semiconductor region PRG is provided in the p-type body region PB below the region GPA as illustrated in FIG. 28. Note that "off" means rise (rising) of the source-drain voltage Vds, and "on" means drop (fall) of the source-drain voltage Vds.

As illustrated in FIG. 30, the peak electric field strength decreases as the film thickness of the field insulating film increases. When the film thickness of the field insulating film is 1.5 μm or more, the electric field strength becomes 3 MV/cm or less.

4) Comparison with Other Simulations

For example, according to the studies by the present inventors based on the Emax equation described in "Equation 3" of JP 5692227 B2), the electric field applied to the field oxide film (0.3 μm) is about 0.13 MV/cm, which is sufficiently lower than the breakdown electric field strength (for example, 10 MV/cm). However, according to the studies of the present inventors, as described above, breakdown of the field oxide film (0.3 μm) was confirmed. Such deviation between the studies and the experiment is considered to be due to rough approximation of the Emax equation described in "Equation 3", and a result based on the experiment would have been obtained by circuit simulation making the above-described gate pad region into the equivalent circuit.

As described above, according to the semiconductor device of the present embodiment, the film thickness of the insulating film (field oxide film) IL1 is set to 0.7 μm or more, whereby the breakdown of the insulating film (field oxide film) IL1 can be suppressed even if the surge voltage occurs. In addition, the electric field strength applied to the insulating film (field oxide film) IL1 can be suppressed to 3 MV/cm or less.

Further, even in the case of the configuration in which the opening portion OA is provided in the gate electrode GE below the gate pad GP by setting the film thickness of the insulating film (field oxide film) IL1 to 1.5 μm or more, and where the residue of the gate electrode remains in the opening portion, breakdown of the insulating film (field oxide film) IL1 can be suppressed. In addition, the electric field strength applied to the insulating film (field oxide film) IL1 can be suppressed to 3 MV/cm or less.

Second Embodiment

Figure 31:
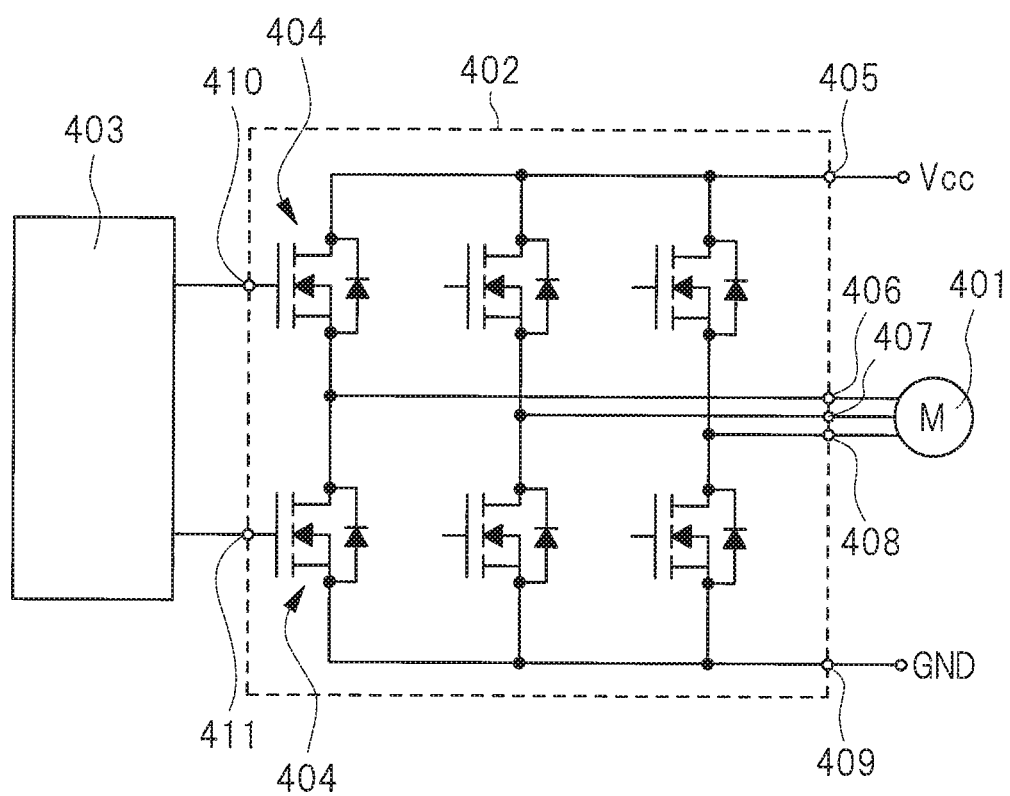
FIG. 31 is a circuit diagram of a power conversion device (inverter) according to a second embodiment.

In the present embodiment, a power conversion device including the semiconductor device (SiC power device) according to the first embodiment will be described. FIG. 31 is a circuit diagram of a power conversion device (inverter) according to the present embodiment. As illustrated in FIG. 31, the inverter of the present embodiment includes a plurality of SiC power MOSFETs (also called metal insulator semiconductor FETs (MISFETs)) 404 that are switching devices in a power module 402. In each single phase, the SiC power MOSFET 404 is connected between a power supply voltage Vcc and an input potential of a load (for example, a motor) 401 via terminals 405 to 409, and the SiC power MOSFET 404 constitutes an upper arm. Further, the SiC power MOSFET 404 is also connected between the input potential of the load 401 and a ground potential GND, and the SiC power MOSFET 404 constitutes a lower arm. That is, in the load 401, two SiC power MOSFETs 404 are provided in each single phase, and six switching devices (SiC power MOSFETs 404) are provided in three phases.

The power supply voltage Vcc is connected to a drain electrode of the SiC power MOSFET 404 of each single phase via the terminal 405 and the ground potential GND is connected to a source electrode of the SiC power MOSFET 404 of each single phase via the terminal 409. In addition, the load 401 is connected to the source electrode of the SiC power MOSFET 404 of each single phase of the upper arm of each single phase via each of the terminals 406 to 408, and is connected to the drain electrode of the SiC power MOSFET 404 of each single phase of the lower arm of each single phase via each of the terminals 406 to 408.

Further, a control circuit 403 is connected to the gate electrodes of the individual SiC power MOSFETs 404 via terminals 410 and 411, and the SiC power MOSFETs 404 are controlled by the control circuit 403. Therefore, the inverter of the present embodiment can drive the load 401 by controlling the current flowing in the SiC power MOSFETs 404 constituting the power module 402 by the control circuit 403.

The MOSFET formed in the semiconductor chip (see FIG. 1) described in the first embodiment is used for the SiC power MOSFET 404. As illustrated in FIG. 31, the power conversion device has the MOSFET and the body diode (built-in pn diode) described in the first embodiment.

That is, an anode of the body diode is connected to the source electrode of the MOSFET, and a cathode is connected to the drain electrode of the MOSFET. Therefore, in each single phase illustrated in FIG. 31, the body diode is connected in antiparallel to the MOSFET. The function of the body diode at this time will be described below.

In the case where the load 401 is a pure resistance that does not include an inductance, the body diode is unnecessary because there is no energy to return. However, in the case where a circuit including an inductance such as a motor (electric motor) is connected to the load 401, there is a mode in which a load current flows in a reverse direction to the MOSFET that is an ON switching device. At this time, since the MOSFET alone does not have a function to cause the load current to flow in the reverse direction, the body diode needs to be connected in antiparallel to the MOSFET.

That is, in the power module 402, in the case where the load 401 includes an inductance like a motor, for example, the energy stored in the inductance must be discharged when the MOSFET is turned OFF. However, the MOSFET alone cannot cause a reverse current to flow to release the energy stored in the inductance. Therefore, to return the electric energy stored in the inductance, the body diode is connected to the MOSFET in the reverse direction. That is, the body diode has a function to cause the reverse current to flow to release the electric energy stored in the inductance.

In the case of configuring the power module 402 with the MOSFET and the diode, it is conceivable to connect a semiconductor chip provided with the diode to a semiconductor chip provided with the MOSFET. However, in this case, the semiconductor chip including the diode needs to be provided in addition to the semiconductor chip including the MOSFET, there is a problem of an increase in size of the power module 402 and the inverter. Even in the case of mixedly mounting a Schottky barrier diode or the like connected to the MOSFET on the semiconductor chip on which the MOSFET is formed instead of separately preparing the semiconductor chip including the diode, there is the problem of an increase in size of the power module 402 and the inverter. In addition, preparing the diode as described above without performing diode-less formation causes an increase in manufacturing cost of the semiconductor device.

In contrast, in the present embodiment, the MOSFET and the body diode described in the first embodiment are used in the power module 402. That is, the MOSFET illustrated in FIG. 4 and the body diode connected in antiparallel thereto are provided on one semiconductor chip. A semiconductor chip including basal plane dislocation has a problem of occurrence of current conduction deterioration when a pn current flows in the body diode. However, in the semiconductor device described in the first embodiment, the current conduction deterioration can be suppressed when a pn current flows in the built-in diode and a peripheral region. With this configuration, the downsizing, weight reduction, and cost reduction of the device can be realized while preventing the current conduction deterioration for the power conversion device including the inverter including the power module 402.

In addition, the power conversion device can be used in a three-phase motor system. The load 401 illustrated in FIG. 31 is a three-phase motor, and the three-phase motor system can be downsized by using the power conversion device including the semiconductor device described in the first embodiment for the inverter.

Third Embodiment

Figure 32:
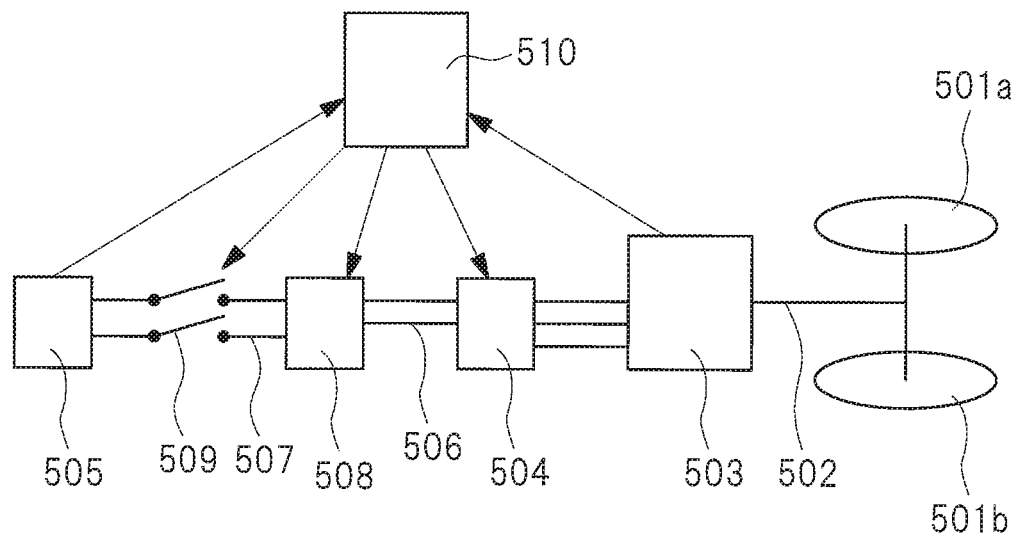
FIG. 32 is a schematic diagram illustrating a configuration of an electric vehicle according to a third embodiment.
Figure 33:
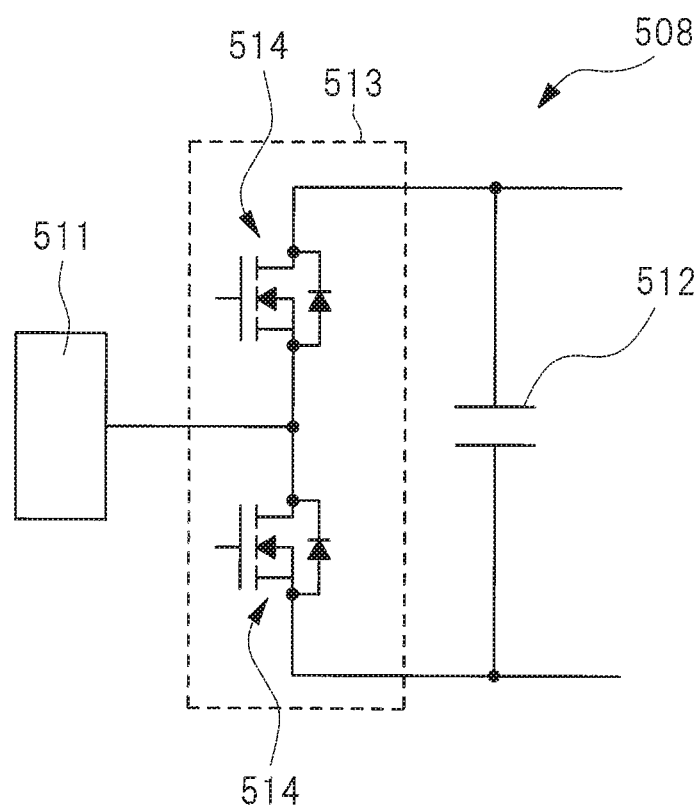
FIG. 33 is a circuit diagram of a boost converter according to the third embodiment.

The three-phase motor system described in the second embodiment can be used in automobiles such as hybrid vehicles, electric vehicles, and fuel cell vehicles. In the present embodiment, an automobile equipped with a three-phase motor system will be described with reference to FIGS. 32 and 33. FIG. 32 is a schematic diagram illustrating a configuration of an electric vehicle according to the present embodiment. FIG. 33 is a circuit diagram of a boost converter according to the present embodiment.

As illustrated in FIG. 32, the electric vehicle of the present embodiment includes a three-phase motor 503 that enables input and output of power to and from a drive shaft 502 to which a drive wheel (wheel) 501a and a drive wheel (wheel) 501b are connected, an inverter 504 for driving the three-phase motor 503, and a battery 505. Furthermore, the electric vehicle of the present embodiment includes a boost converter 508, a relay 509, and an electronic control unit 510. The boost converter 508 is connected to a power line 506 to which the inverter 504 is connected and a power line 507 to which the battery 505 is connected. The three-phase motor 503 is a synchronous generator motor including a rotor in which a permanent magnet is embedded and a stator around which a three-phase coil is wound. As the inverter 504, the inverter described in the second embodiment is used.

As illustrated in FIG. 33, the boost converter 508 has a configuration in which a reactor 511 and a smoothing capacitor 512 are connected to an inverter 513. The inverter 513 is, for example, similar to the inverter described in the second embodiment, and a device configuration in the inverter is also the same. Also in this case, switching devices are SiC power MOSFETs 514 and are synchronously driven and rectified. In the electric vehicle according to the present embodiment, the output is supplied to the three-phase motor 503, using the inverter 504 as an electric power conversion device and the boost converter 508 as a power conversion device, whereby the drive wheel (wheel) 501a and the drive wheel (wheel) 501b are driven by the three-phase motor 503.

The electronic control unit 510 in FIG. 32 includes a microprocessor, a storage device, and an input/output port, and receives a signal from a sensor that detects a rotor position of the three-phase motor 503, a charge/discharge value of the battery 505, and the like. The electronic control unit 510 outputs signals for controlling the inverter 504, the boost converter 508, and the relay 509.

According to the present embodiment, the power conversion device in the second embodiment can be used for the inverter 504 and the boost converter 508 as power conversion devices. In addition, the three-phase motor system according to the second embodiment can be used as the three-phase motor system including the three-phase motor 503, the inverter 504, and the like. With the configuration, the volume of the drive system occupied in the electric vehicle is decreased while preventing current conduction deterioration of the inverter 504 and the boost converter 508 of the electric vehicle, whereby the downsizing, weight reduction, and cost reduction of the electric vehicle can be realized.

Although the electric vehicle has been described in the present embodiment, the above-described three-phase motor system can be similarly applied to a hybrid vehicle equipped with an engine, and a fuel cell vehicle in which the battery 505 is a fuel cell stack.

Fourth Embodiment

Figure 34:
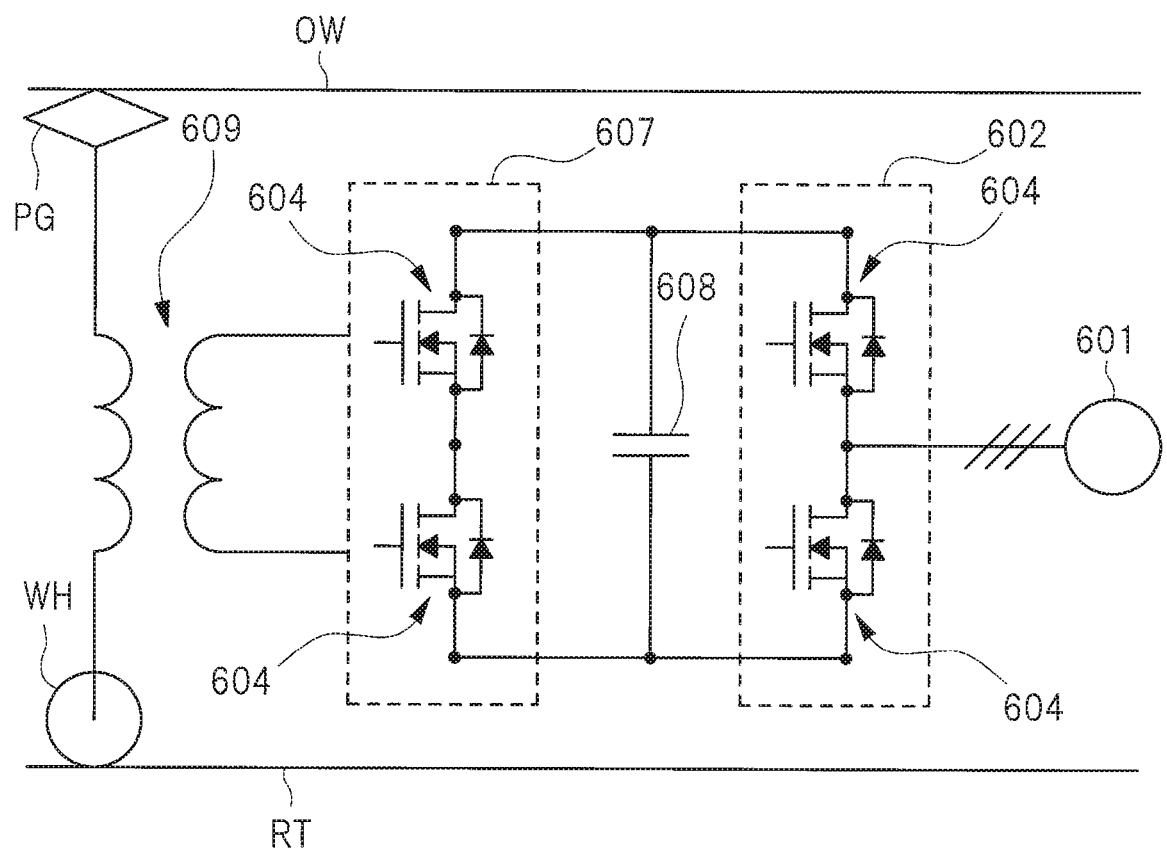
FIG. 34 is a circuit diagram including a converter and an inverter of a railway vehicle according to a fourth embodiment.

The three-phase motor system of the second embodiment can be used for railway vehicles. In the present embodiment, a railway vehicle using a three-phase motor system will be described. FIG. 34 is a circuit diagram including a converter and an inverter of a railway vehicle according to the present embodiment.

As illustrated in FIG. 34, power of 25 kV is supplied to the railway vehicle from an overhead wire OW via a pantograph PG, for example. The voltage is reduced to 1.5 kV via a transformer 609 and an alternating current is converted into a direct current by a converter 607. Further, the direct current is converted into the alternating current by an inverter 602 via a capacitor 608, and a three-phase motor as a load 601 is driven. In the present embodiment, switching devices are synchronously driven and rectified as SiC power MOSFETs 604. Note that the overhead wire OW is electrically connected to a line RT via the pantograph PG, the transformer 609, and wheels WH.

According to the present embodiment, the power conversion device of the second embodiment can be used for the converter 607. That is, the power is supplied from the power conversion device to the load 601, thereby to drive the wheels WH of the railway vehicle. In addition, the three-phase motor system according to the second embodiment can be used as the three-phase motor system including the load 601, the inverter 602, and a control circuit. With the configuration, the downsizing, weight reduction, and cost reduction of the railway vehicle can be realized while preventing current conduction deterioration of the inverter 602 and the converter 607 of the railway vehicle.

Fifth Embodiment

Figure 35:
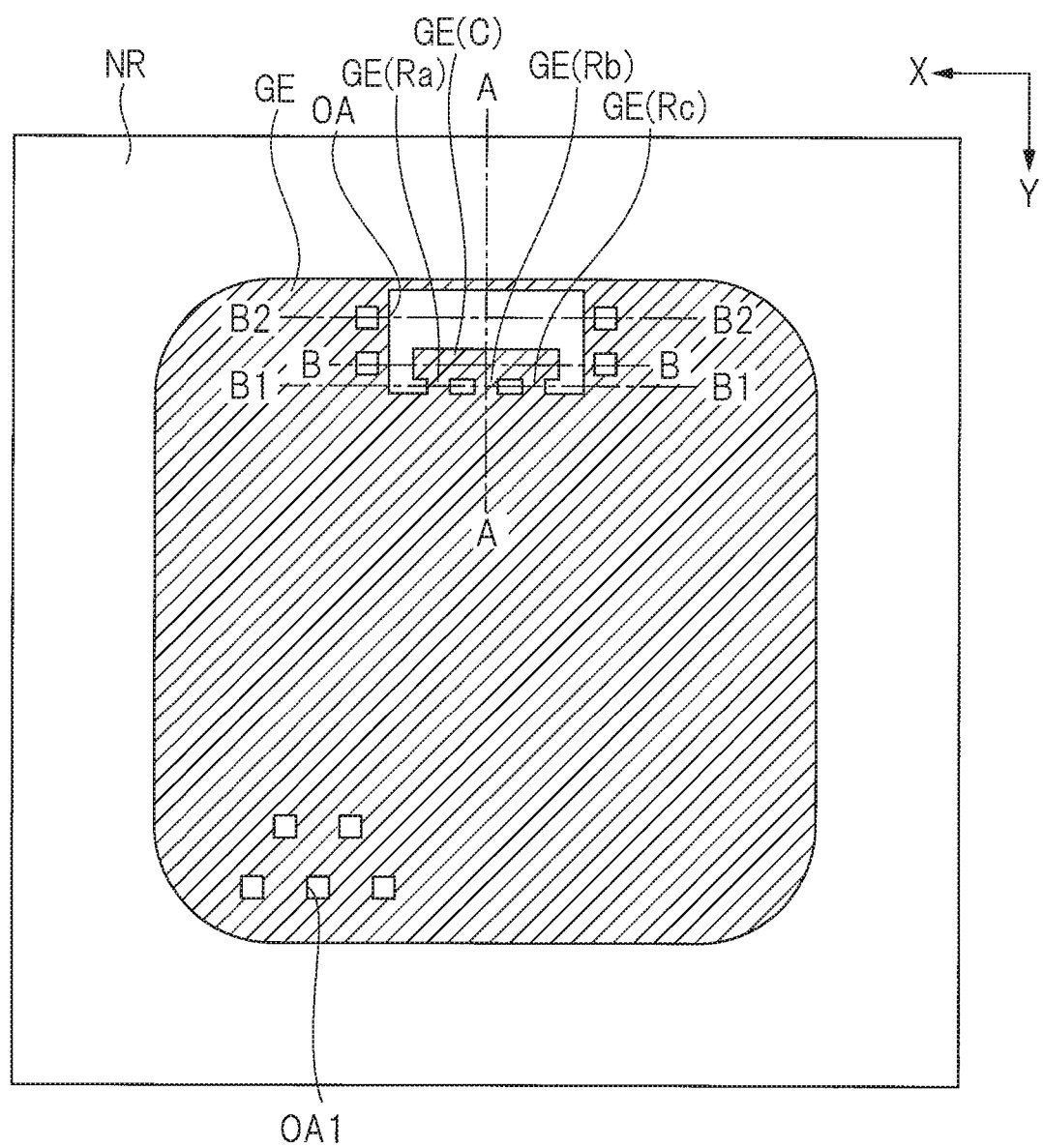
FIG. 35 is a plan view illustrating a configuration of a semiconductor device according to a first application of a fifth embodiment.

In the present embodiment, applications of the first embodiment will be described.
(First Application)
FIG. 35 is a plan view illustrating a configuration of a semiconductor device according to a first application of the present embodiment.

In the semiconductor device (FIG. 2) according to the first embodiment, one resistance portion GE(R) is connected between the gate pad GP and the gate electrode GE. However, as illustrated in FIG. 35, a plurality of resistance portions GE(R) may be connected in parallel between a gate pad GP and a gate electrode GE.
(Second Application)
FIG. 36 is a plan view illustrating a configuration of a semiconductor device according to a second application of the present embodiment.

Figure 36:
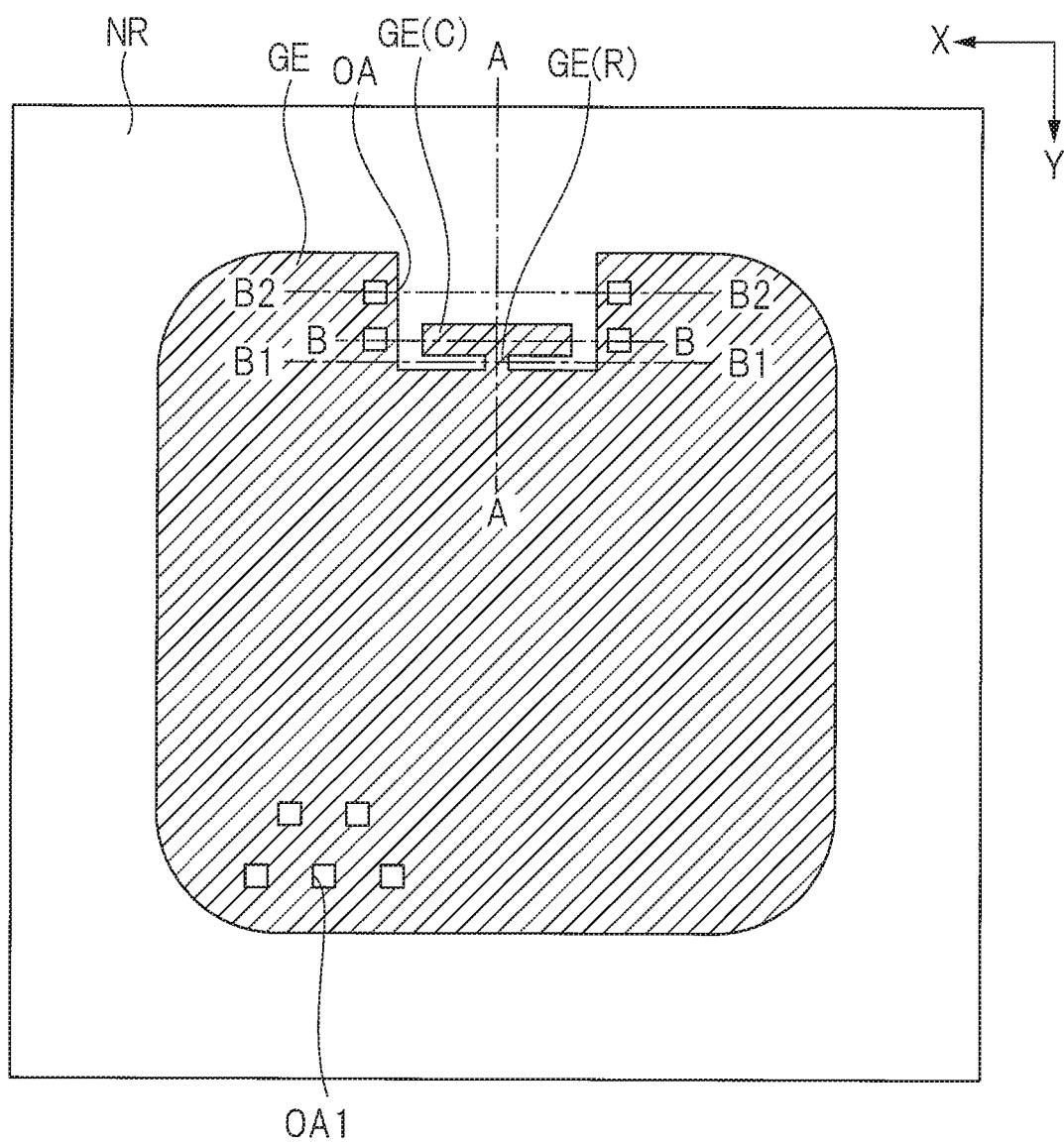
FIG. 36 is a plan view illustrating a configuration of a semiconductor device according to a second application of the fifth embodiment.

As illustrated in FIG. 36, a gate electrode GE portion extending in an X direction of an opening portion OA may be omitted.
(Third Application)
FIG. 37 is a plan view illustrating a configuration of a semiconductor device according to a third application of the present embodiment.

Figure 37:
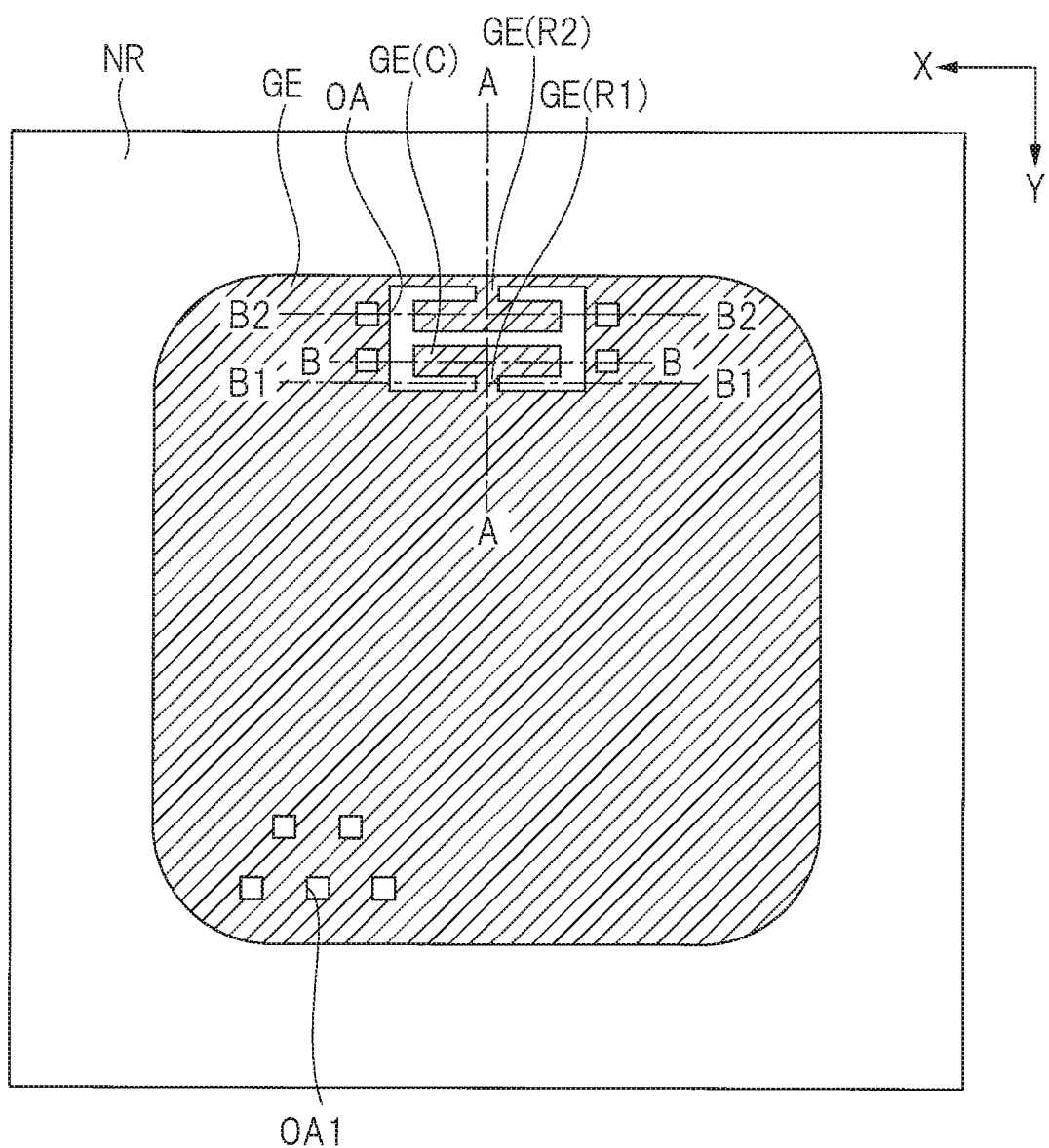
FIG. 37 is a plan view illustrating a configuration of a semiconductor device according to a third application of the fifth embodiment.

As illustrated in FIG. 37, another resistance portion GE(R2) may be provided in a gate electrode GE portion extending in an X direction of an opening portion OA.

Note that the semiconductor device of the present embodiment is also applicable to the power conversion device described in the second embodiment, the three-phase motor system described in the third embodiment, the inverter and the converter of the railway vehicle described in the fourth embodiment, and the like.

Although the invention made by the present inventors has been concretely described on the basis of the embodiments of the invention, the present invention is not limited to the above-described embodiments, and various modifications can be made within a scope not deviating from the gist of the invention.

What is claimed is:
1. A semiconductor device comprising:
a first conductivity-type drift layer formed on a substrate, having a cell region and a gate pad region, and including silicon carbide;
a unit cell formed in the cell region;
(a1) a second conductivity-type first body region having a reverse conductivity-type to the first conductivity-type, and formed in the drift layer in the gate pad region;
(a2) a first insulating film formed on the first body region;
(a3) a first conductive film formed on the first insulating film;
(a4) a second insulating film formed on the first conductive film; and
(a5) a gate pad formed on the second insulating film, wherein
a film thickness of the first insulating film is 0.7 µm or more.
2. The semiconductor device according to claim 1, wherein
the film thickness of the first insulating film is 1.5 µm or more.
3. The semiconductor device according to claim 1, wherein
electric field strength of the first insulating film is 3 MV/cm or less.
4. The semiconductor device according to claim 1, wherein
the unit cell includes:
(b1) a second conductivity-type second body region formed in the drift layer in the cell region;
(b2) a first conductivity-type source region formed in the second body region;
(b3) a gate insulating film formed on the second body region between the source region and the drift layer; and
(b4) a gate electrode formed on the gate insulating film.
5. The semiconductor device according to claim 4, further comprising:
a source electrode electrically connected to the source region, wherein
the first body region is electrically connected to the source electrode via a contact penetrating the first insulating film or the second insulating film.
6. A semiconductor device comprising:
a first conductivity-type drift layer formed on a substrate, having a cell region and a gate pad region, and including silicon carbide;
a unit cell formed in the cell region;
(a1) a second conductivity-type first body region having a reverse conductivity-type to the first conductivity-type, and formed in the drift layer in the gate pad region;
(a2) a first insulating film formed on the first body region;
(a3) a first conductive film formed on the first insulating film;
(a4) a second insulating film formed on the first conductive film; and
(a5) a gate pad formed on the second insulating film, wherein
a film thickness of the first insulating film is 1.5 µm or more, and
a region in which the first conductive film is not formed is included on the first insulating film in the gate pad region.
7. The semiconductor device according to claim 6, wherein
electric field strength of the first insulating film is 3 MV/cm or less.
8. The semiconductor device according to claim 6, wherein
the unit cell includes:
(b1) a second conductivity-type second body region formed in the drift layer in the cell region;
(b2) a first conductivity-type source region formed in the second body region;

(b3) a gate insulating film formed on the second body region between the source region and the drift layer; and (b4) a gate electrode formed on the gate insulating film.

9. The semiconductor device according to claim 8, wherein the first conductive film has a first portion and a second portion connected to the first portion, and a length of an opening portion in a first direction is larger than a length of the first portion in the first direction.

10. The semiconductor device according to claim 9, wherein the first portion is a resistance portion connected between the gate pad and the gate electrode.

11. The semiconductor device according to claim 8, further comprising:

a source electrode electrically connected to the source region, wherein the first body region is electrically connected to the source electrode via a contact penetrating the first insulating film or the second insulating film.

12. A power module comprising:

a semiconductor device comprising a first conductivity-type drift layer formed on a substrate, having a cell region and a gate pad region, and including silicon carbide;

a unit cell formed in the cell region;

(a1) a second conductivity-type first body region having a reverse conductivity-type to the first conductivity-type, and formed in the drift layer in the gate pad region;

(a2) a first insulating film formed on the first body region;

(a3) a first conductive film formed on the first insulating film;

(a4) a second insulating film formed on the first conductive film; and (a5) a gate pad formed on the second insulating film, wherein a film thickness of the first insulating film is 0.7 μm or more.

13. The power module according to claim 12, further comprising:

an inverter configured by a MOSFET constituting the unit cell including a semiconductor device comprising a first conductivity-type drift layer formed on a substrate, having a cell region and a gate pad region, and including silicon carbide;

a unit cell formed in the cell region;

(a1) a second conductivity-type first body region having a reverse conductivity-type to the first conductivity-type, and formed in the drift layer in the gate pad region;

(a2) a first insulating film formed on the first body region;

(a3) a first conductive film formed on the first insulating film;

(a4) a second insulating film formed on the first conductive film; and (a5) a gate pad formed on the second insulating film, wherein a film thickness of the first insulating film is 0.7 μm or more.

14. A power conversion device comprising:

a power module comprising a semiconductor device comprising a first conductivity-type drift layer formed on a substrate, having a cell region and a gate pad region, and including silicon carbide;

a unit cell formed in the cell region:

(a1) a second conductivity-type first body region having a reverse conductivity-type to the first conductivity-type, and formed in the drift layer in the gate pad region;

(a2) a first insulating film formed on the first body region:

(a3) a first conductive film formed on the first insulating film;

(a4) a second insulating film formed on the first conductive film; and (a5) a gate pad formed on the second insulating film, wherein a film thickness of the first insulating film is 0.7 μm or more; and a control circuit configured to control the semiconductor device in the power module.

15. The power conversion device according to claim 14, wherein the power module includes an inverter configured by a MOSFET constituting the unit cell including a semiconductor device comprising a first conductivity-type drift layer formed on a substrate, having a cell region and a gate pad region, and including silicon carbide;

a unit cell formed in the cell region;

(a1) a second conductivity-type first body region having a reverse conductivity-type to the first conductivity-type, and formed in the drift layer in the gate pad region;

(a2) a first insulating film formed on the first body region;

(a3) a first conductive film formed on the first insulating film;

(a4) a second insulating film formed on the first conductive film; and (a5) a gate Dad formed on the second insulating film, wherein a film thickness of the first insulating film is 0.7 μm or more.

* * * * *